(12) United States Patent
Hiraga

(10) Patent No.: US 12,159,670 B2
(45) Date of Patent: Dec. 3, 2024

(54) NON-VOLATILE STORAGE CIRCUIT

(71) Applicant: Sony Semiconductor Solutions Corporation, Kanagawa (JP)

(72) Inventor: Keizo Hiraga, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/766,568

(22) PCT Filed: Oct. 16, 2020

(86) PCT No.: PCT/JP2020/039601
§ 371 (c)(1),
(2) Date: Apr. 5, 2022

(87) PCT Pub. No.: WO2021/075539
PCT Pub. Date: Apr. 22, 2021

(65) Prior Publication Data
US 2024/0105261 A1    Mar. 28, 2024

(30) Foreign Application Priority Data

Oct. 18, 2019    (JP) ................. 2019-191408

(51) Int. Cl.
*G11C 14/00* (2006.01)
*G11C 5/14* (2006.01)
(52) U.S. Cl.
CPC .......... *G11C 14/0081* (2013.01); *G11C 5/148* (2013.01)

(58) Field of Classification Search
CPC ..... G11C 14/0081; G11C 5/148; G11C 5/141; G11C 11/16; G11C 13/00; G11C 14/009; G11C 16/12; G11C 16/30; G11C 16/32
See application file for complete search history.

(56) References Cited

U.S. PATENT DOCUMENTS 8,693,238 B2 * 4/2014 Sakimura ................. G11C 8/08
 365/158
10,373,663 B2 * 8/2019 Usami .................... G11C 11/161
(Continued)

FOREIGN PATENT DOCUMENTS

WO    WO2016/185903 A1    11/2016
WO    WO2018/088297 A1    5/2018

OTHER PUBLICATIONS

International Search Report issued in International Patent Application No. PCT/JP2020/039061 on Nov. 24, 2020 and English translation of same. 5 pages.
(Continued)

*Primary Examiner* — Khamdan N. Alrobaie
(74) *Attorney, Agent, or Firm* — K&L Gates LLP

(57) ABSTRACT

A non-volatile storage circuit (10) of an embodiment includes a volatile storage unit (11) that stores information, a non-volatile storage unit (20) into which the information in the volatile storage unit is written by a store operation, and from which the information is read out to the volatile storage unit (11) by a restore operation via a restore path different from a store path in the store operation, a driver unit (12, 15) that receives a power supply and performs the store operation, and a switch unit (13, 14, 16, 17) that shuts off the power supply to the driver unit (12, 15) during the restore operation.

7 Claims, 13 Drawing Sheets

(56) References Cited

U.S. PATENT DOCUMENTS

| | | | |
|---|---|---|---|
| 2011/0216573 A1* | 9/2011 | Abe | G11C 14/0081 |
| | | | 365/158 |
| 2013/0028012 A1* | 1/2013 | Fujita | G11C 14/0081 |
| | | | 365/158 |
| 2015/0016176 A1* | 1/2015 | Chuang | G11C 14/009 |
| | | | 365/148 |
| 2019/0333574 A1 | 10/2019 | Shuto et al. | |

OTHER PUBLICATIONS

Written Opinion issued in International Patent Application No. PCT/JP2020/039061 on Nov. 24, 2020. 4 pages.

* cited by examiner

NON-VOLATILE STORAGE CIRCUIT

FIELD

The present disclosure relates to a non-volatile storage circuit.

BACKGROUND

Conventionally, power gating (PG) is known as a low power consumption technique for reducing leakage current.

In addition, as a non-volatile flip-flop (NVFF) using PG, a PG-applied flip-flop circuit connected to a magnetic tunnel junction (MTJ), which is a non-volatile element, to allow logic restoration on the spot when a power supply is restored has been proposed (for example, see Patent Literature 1). The NVFF using such MTJ can suppress power consumption to some extent while maintaining stable writing.

CITATION LIST

Patent Literature

Patent Literature 1: WO 2016/185903 A

SUMMARY

Technical Problem

However, in order to allow a sufficiently large current to flow when writing (storing) logic to the MTJ, a driver having a large current supply capacity and having a transistor group with a large power supply capacity that can operate as an inverter is required. However, depending on a balance of transistors that configure a restore path at a time of logic restoration (restore) from the MTJ, a driver input becomes an intermediate potential, and a power supply (high potential side power supply) and a ground (low potential side power supply) may be shorted to cause a large current to flow and increase power consumption.

The present technique has been made in view of such a circumstance, and an object thereof is to achieve a non-volatile storage circuit capable of reducing power consumption while maintaining stable writing.

Solution to Problem

A non-volatile storage circuit of an embodiment includes a volatile storage unit that stores information, a non-volatile storage unit into which the information in the volatile storage unit is written by a store operation, and from which the information is read out to the volatile storage unit by a restore operation via a restore path different from a store path in the store operation, a driver unit that receives a power supply and performs the store operation, and a switch unit that shuts off the power supply to the driver unit during the restore operation.

DESCRIPTION OF EMBODIMENTS

Hereinafter, embodiments will be described in detail with reference to the drawings.

[1] First Embodiment

Figure 1:
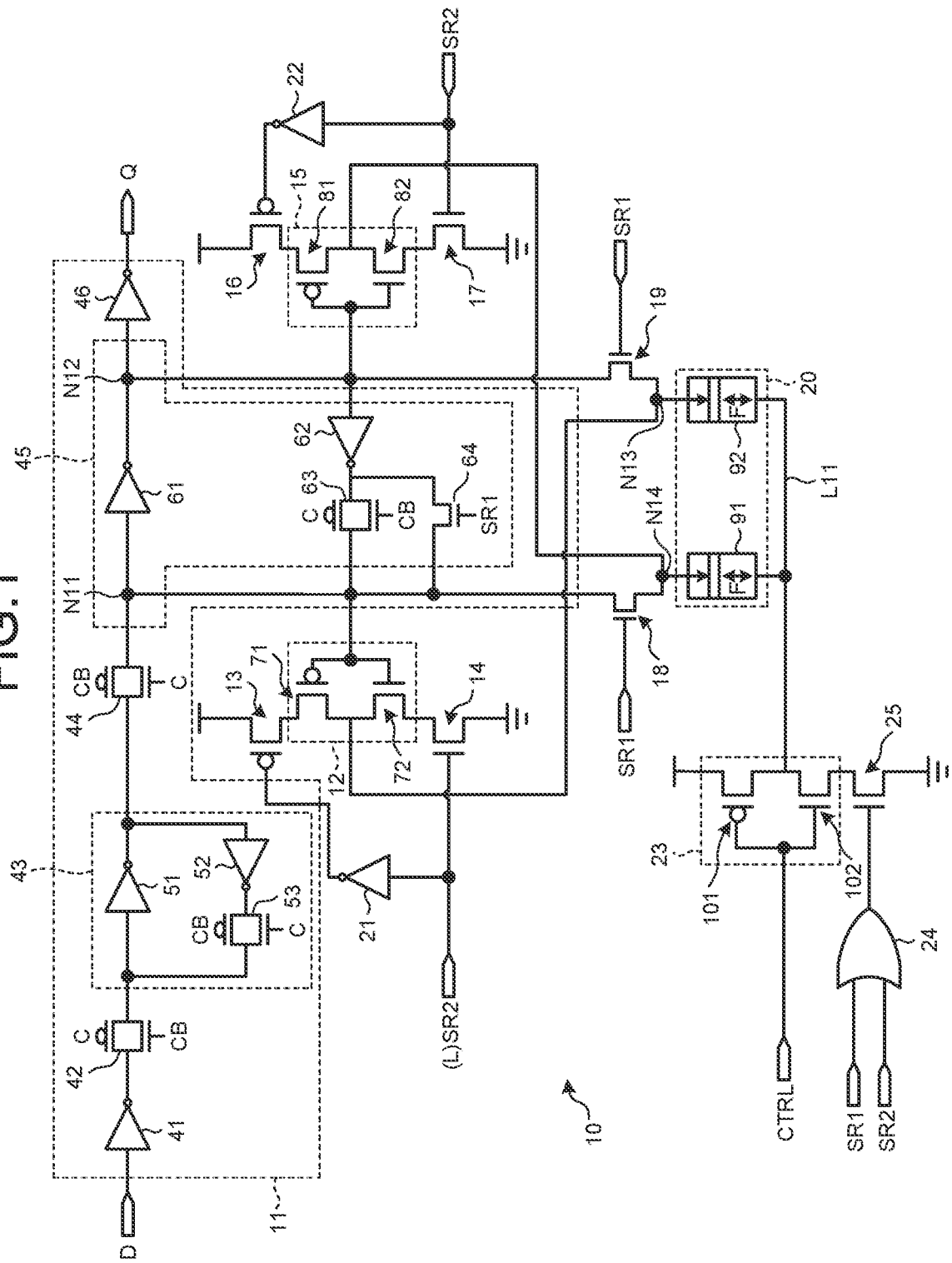
FIG. 1 is a diagram illustrating a configuration example of an NVDFF circuit of a header type SSR-NVFF circuit system according to a first embodiment.

FIG. 1 illustrates a configuration example of a non-volatile D flip-flop (NVDFF) of a header type split store/restore-non-volatile flip-flop (SSR-NVFF) circuit system as a non-volatile storage circuit to which the present technique is applied.

An NVDFF circuit 10 illustrated in FIG. 1 includes a volatile storage unit 11, a store driver 12, a transistor 13, a transistor 14, a store driver 15, a transistor 16, a transistor 17, a transistor 18, a transistor 19, a non-volatile storage unit 20, an inverter 21, an inverter 22, a control driver 23, an OR circuit 24, and a transistor 25.

Here, the transistor 13 and the transistor 16 are P-channel MOSFETs. Further, the transistor 14, the transistor 17, the transistor 18, the transistor 19, and the transistor 25 are N-channel MOSFETs.

Although each transistor is represented by one element in FIG. 1, it is actually configured as a group of transistor elements in which elements of the same type are connected in parallel according to a current capacity. Hereinafter, the same applies to other embodiments.

For example, in the NVDFF circuit 10, a P-channel MOS transistor (not illustrated) is used as a power switch for power gating (PG). Specifically, for example, when the power switch is turned on, power is supplied from a power supply line to each part of the NVDFF circuit 10 via the P-channel MOS transistor. Further, when the power switch is turned off, each part of the NVDFF circuit 10 is electrically disconnected from the power supply line to achieve PG.

The volatile storage unit 11 is configured as a flip-flop circuit that temporarily holds storage data that is information supplied from outside, more specifically, a storage node state such as a voltage level corresponding to storage data.

The volatile storage unit 11 includes an inverter 41, a transmission gate 42, a master latch 43, a transmission gate 44, a slave latch 45, and an inverter 46.

In the above configuration, the master latch 43 includes an inverter 51, an inverter 52, and a transmission gate 53.

Further, the slave latch 45 includes an inverter 61, an inverter 62, a transmission gate 63, and a transistor (N-channel MOSFET) 64. Further, the slave latch 45 includes a storage node N11 and a storage node N12.

In the volatile storage unit 11, the transmission gate 42 and the transmission gate 63 are turned on at a timing that a clock signal C falls. Further, the transmission gate 42 and the transmission gate 63 are turned off at a timing that the clock signal C rises.

In other words, the transmission gate 42 and the transmission gate 63 are turned off at a timing that an inverted clock signal CB rises. Further, the transmission gate 42 and the transmission gate 63 are turned on at a timing that the inverted clock signal CB rises.

On the other hand, the transmission gate 53 and the transmission gate 44 are turned off at a timing that the clock signal C falls. Further, the transmission gate 53 and the transmission gate 44 are turned on at a timing that the clock signal C rises.

In other words, the transmission gate 53 and the transmission gate 44 are turned on at a timing that the inverted clock signal CB rises. Further, the transmission gate 53 and the transmission gate 44 are turned off at a timing that the inverted clock signal CB rises.

In the volatile storage unit 11, the input side of the inverter 41 is an input terminal of the volatile storage unit 11. Further, the output side of the inverter 41 is connected to the input side of the inverter 51 via the transmission gate 42.

Further, the storage node N11 of the slave latch 45 is connected to the output side of the inverter 51 via the transmission gate 44. An output terminal of the inverter 51 is also connected to the input side of the inverter 52.

Further, the output side of the inverter 52 is connected to the input side of the inverter 51 via the transmission gate 53. In other words, the output side of the transmission gate 53 is connected between the inverter 51 and the transmission gate 42 via the transmission gate 53.

The slave latch 45 includes the storage node N11 and the storage node N12 that temporarily hold a voltage level corresponding to storage data input. The inverter 61 is provided between the storage node N11 and the storage node N12.

Further, input terminals of the inverter 46, the inverter 62, and the store driver 15 are connected to the storage node N12.

The output side of the inverter 46 is an output terminal of the volatile storage unit 11.

The output side of the inverter 62 is connected to the storage node N11 via the transmission gate 63. Further, the transistor 64, which is the N-channel MOSFET, is connected to both ends of the transmission gate 63. In other words, one end of the transistor 64 is connected to the input side of the transmission gate 63, and the other end of the transistor 64 is connected to the output side of the transmission gate 63.

A restore control signal SR1 having a predetermined voltage level is supplied to a gate of the transistor 64.

An input terminal of the store driver 12 is also connected to the storage node N11.

The store driver 12 is configured as an inverter that is an inverting element. In other words, the store driver 12 includes a transistor 71 that is a P-channel MOSFET and a transistor 72 that is an N-channel MOSFET.

In the store driver 12, the transistor 72 is connected to one terminal of the transistor 71. The other terminal of the transistor 71 is connected to the power supply via the transistor 13.

Here, an inverted signal of a store control signal SR2 is supplied to a gate of the transistor 13 via the inverter 21.

Further, a terminal of the transistor 72 on a side opposite to a terminal to which the transistor 71 is connected is connected to a ground via the transistor 14. Here, the store control signal SR2 is supplied to a gate of the transistor 14.

Further, an output end of an inverter including the transistor 71 and the transistor 72 is connected to the non-volatile storage unit 20 via a node N13.

The store driver 15 is configured as an inverter that is an inverting element. In other words, the store driver 15 includes a transistor 81 that is a P-channel MOSFET and a transistor 82 that is an N-channel MOSFET.

In the store driver 15, the transistor 82 is connected to one terminal of the transistor 81. The other terminal of the transistor 81 is connected to the power supply via the transistor 16.

Here, the inverted signal of the store control signal SR2 is supplied to a gate of the transistor 16 via the inverter 22.

Further, a terminal of the transistor 82 on a side opposite to a terminal to which the transistor 81 is connected is connected to the ground via the transistor 17. Here, the store control signal SR2 is supplied to a gate of the transistor 17.

Further, an output end of an inverter including the transistor 81 and the transistor 82 is connected to the non-volatile storage unit 20 via a node N14.

The non-volatile storage unit 20 is a non-volatile memory. At a time of store (writing), storage data corresponding to a voltage level in the storage node N11 and the storage node N12 is written in the non-volatile storage unit 20.

Further, at a time of restore (reading), the storage data held in the non-volatile storage unit 20, i.e., the voltage level held is read out to the storage node N11 and the storage node N12 via a path different from a storage path.

The non-volatile storage unit 20 includes a storage element 91 and a storage element 92. The storage element 91 and the storage element 92 can be configured as a non-volatile storage element such as a magnetic tunnel junction (MTJ) element that is a magnetoresistive element and a resistive random access memory (ReRAM) that is a resistance change type memory. However, an example in FIG. 1 illustrates the MTJ.

Here, the MTJ will be described.

The MTJ includes a pinned layer (P layer), a free layer (F layer), and a barrier layer formed between the pinned layer and the free layer. The MTJ is a non-volatile storage element that can change resistance to a high resistance state or a low resistance state depending on voltage applied.

Therefore, for example, the high resistance state of the MTJ can be associated with an "H" level indicating a high voltage level, i.e., "1" as storage data, to store information in the MTJ. Similarly, the low resistance state of the MTJ can be associated with an "L" level indicating a low voltage level, i.e., "0" as storage data, to store information in the MTJ.

Hereinafter, in the description of the embodiments, the low resistance state of the MTJ will be referred to as a parallel state (hereinafter referred to as a P state), and the high resistance state will be referred to as an anti-parallel state (hereinafter referred to as an AP state).

In the non-volatile storage unit 20, a free layer (F layer) of the storage element 91 is connected to a control line L11, and a side opposite to the free layer, i.e., a pinned layer (P layer) of the storage element 91, is connected to the node N14.

The node N14 is connected to an output end of the store driver 15 and is also connected to the storage node N11 via the transistor 18.

Similarly, the free layer of the storage element 92 is connected to the control line L11, and the pinned layer of the storage element 92 is connected to the node N13.

The node N13 is connected to an output end of the store driver 12, and is also connected to the storage node N12 via the transistor 19.

The restore control signal SR1 is supplied to gates of the transistor 18 and the transistor 19.

Further, the control driver 23 for controlling a voltage level in the control line L11 is connected to the control line L11 that is connected to the storage element 91 and the storage element 92.

The control driver 23 includes an inverter that is an inverting element. In other words, the control driver 23 includes a transistor 101 that is a P-channel MOSFET, and a transistor 102 that is an N-channel MOSFET.

In the control driver 23, one terminal of the transistor 101 is connected to the power supply, and the transistor 102 and the control line L11 are connected to the other terminal of the transistor 101.

Further, a terminal of the transistor 102 opposite to the terminal to which the transistor 101 and the control line L11 are connected is connected to the ground via the transistor 25.

A control signal CTRL is supplied to an input terminal of the control driver 23, i.e., gates of the transistor 101 and the gate of the transistor 102.

An output end of the OR circuit 24 is connected to a gate of the transistor 25, and the restore control signal SR1 and the store control signal SR2 are supplied to an input end of the OR circuit 24.

For example, when one NVDFF circuit 10 is regarded as one cell configuring a memory and a plurality of cells are provided in the memory, the transistor 25 in each NVDFF circuit 10 is configured to turn on in a store mode and a restore mode.

At this time, as the OR circuit 24 for turning on the transistor 25, one common OR circuit may be provided to all the plurality of cells, i.e., all the plurality of NVDFF circuits 10.

Next, the operation of the NVDFF circuit 10 of the first embodiment will be described.

As an operation mode in the NVDFF circuit 10, there are four operation modes: an active mode, the store mode, a sleep mode, and the restore mode.

When the NVDFF circuit 10 operates, the operation modes are sequentially changed in an order of active mode-→store mode→sleep mode→restore mode.

First, in the active mode, a power switch (not illustrated) is turned on.

Further, the restore control signal SR1 is set to the "H" level, and the transistor 18 and the transistor 19 are turned on. In other words, the transistor 18 and the transistor 19 are in an on state (conducting state).

At this time, since the store control signal SR2 is set to the "L" level, the transistor 14 and the transistor 17 are turned off (non-conducting state). Further, the inverter 21 and the inverter 22 output the "H" level, and the transistor 13 and the transistor 16 are also turned off (non-conducting state).

Therefore, the store driver 12 and the store driver 15 become a state that power is not supplied.

In this condition, when the "L" level is input to the inverter 41 as the storage data, for example, the inverter 41 outputs the "H" level. This "H" level signal is input to the inverter 51 at the timing that the clock signal C falls, i.e., the timing that the transmission gate 42 is turned on.

Then, at the timing that the clock signal C rises next time, the transmission gate 53 and the transmission gate 44 are turned on. As a result, the inverter 51 outputs the "L" level due to a loop of the inverter 51 and the inverter 52. This "L" level signal, which is the output of the inverter 51, is supplied as the storage data to the storage node N11 via the transmission gate 44.

As a result, the inverter 61 connected to the storage node N11 outputs the "H" level, and the inverter 46 connected to the storage node N12 outputs the "L" level.

After that, at the timing that the clock signal C falls, the transmission gate 53 and the transmission gate 44 are turned off. At the timing that the clock signal C falls in parallel, the transmission gate 42 and the transmission gate 63 are turned on. As a result, the storage node N11 holds (stores) the "L" level indicating the storage data due to a loop of the inverter 61 and the inverter 62. Similarly, the storage node N12 holds the "H" level that is inverted storage data.

When the storage data input in this way is latched by the slave latch 45, a toggle of the clock signal C will be stopped.

Next, in the store mode, the restore control signal SR1 is set to the "L" level, and the transistor 18 and the transistor 19 are turned off. In other words, the transistor 18 and the transistor 19 become the non-conducting state.

At this time, since the store control signal SR2 is set to the "H" level, the transistor 14 and the transistor 17 are turned on (conducting state). Further, the inverter 21 and the inverter 22 output the "L" level, and the transistor 13 and the transistor 16 are also turned on (conducting state).

Therefore, the store driver 12 and the store driver 15 become a state that power is supplied.

At this time, the OR circuit 24 to which the control signal SR1 and the control signal SR2 are supplied (input) outputs the "H" level, so that the transistor 25 in which the "H" level signal is supplied to the gate is turned on.

Then, since the state of the storage node N11 is the "L" level, the transistor 71 is turned on in the store driver 12 connected to the storage node N11, and the output end of the store driver 12, i.e., the node N13 becomes the "H" level.

On the other hand, since the state of the storage node N12 is the "H" level, the transistor 82 is turned on in the store driver 15 connected to the storage node N12, and the output end of the store driver 15, i.e., the node N14 becomes the "L" level.

Further, at this timing, when the control signal CTRL is set to the "L" level, for example, the transistor 101 is turned on in a control driver 29 and the output end of the control driver 23, i.e., the control line L11, becomes the "H" level.

Figure 2:
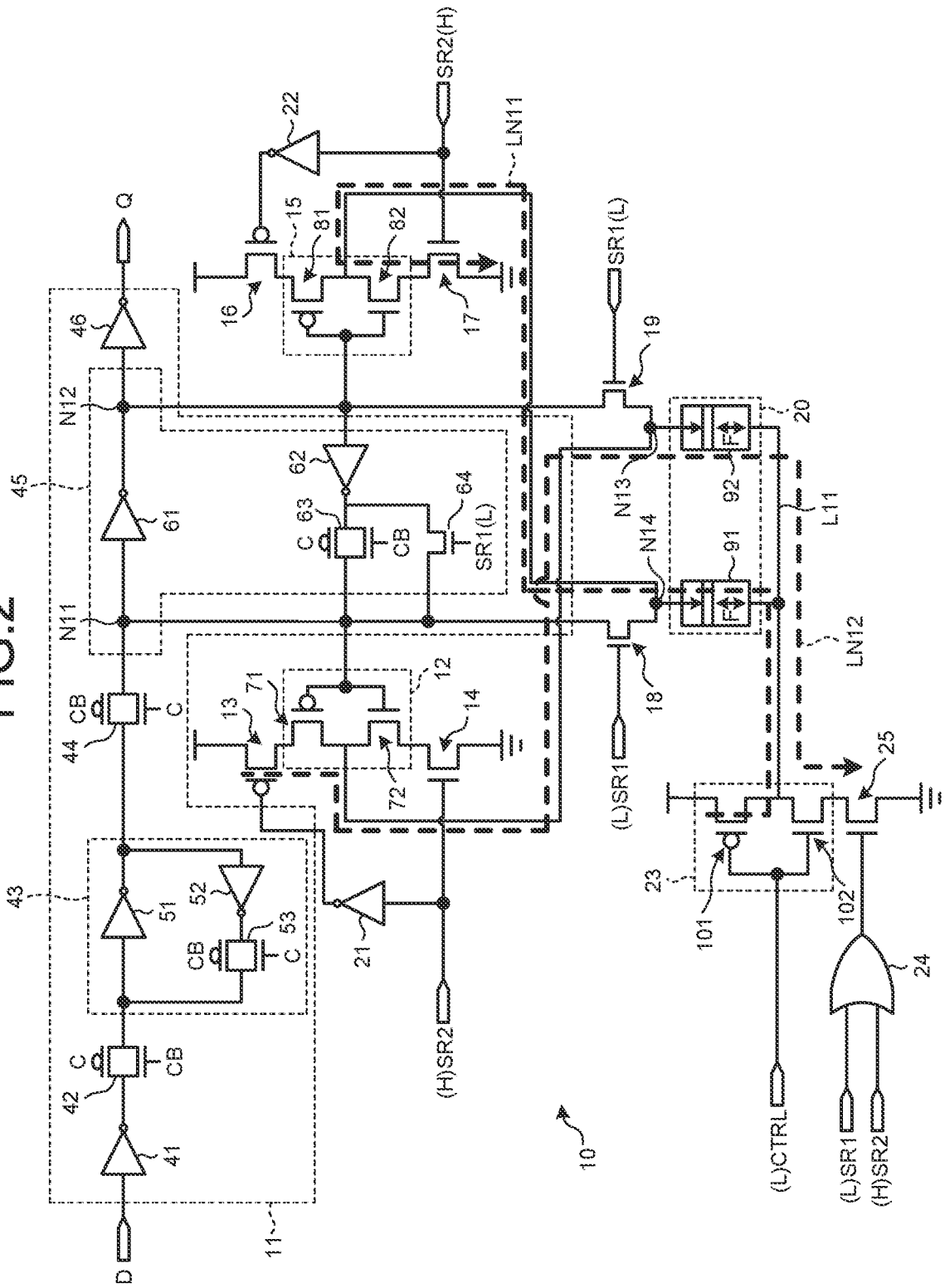
FIG. 2 is an explanatory diagram of a store path.

FIG. 2 is an explanatory diagram of the store path.

Here, since the control line L11 is at the "H" level and the node N14 is at the "L" level, the store current flows from the power supply connected to the control driver 23 to the ground, as illustrated in FIG. 2, via the control driver 23, the control line L11, the storage element 91, the node N14, the transistor 82, and the transistor 17.

In this case, in the storage element 91, current (store current) flows from the free layer (F layer) connected to the control line L11 side to the pinned layer (P layer) connected to the node N14 side, so that the storage element 91 becomes the low resistance state, i.e., the P state.

As a result, the "H" level state held in the storage node N12 is inverted by the store driver 15 and held (stored) in the storage element 91. In other words, the "H" level state held in the storage node N12 is inverted and written (stored) in the storage element 91.

Then, when the control signal CTRL is further switched from the "L" level state to the "H" level state, the transistor 101 is turned off and the transistor 102 is turned on in the control driver 23.

As a result, the control line L11 to which the output terminal of the control driver 29 is connected is connected to the ground via the transistor 25, and becomes the "L" level.

Then, since the control line L11 is at the "L" level and the node N13 is at the "H" level, the store current flows from the power supply connected to the store driver 22 to the ground via the transistor 71, the node N13, the storage element 92, the control line L11, the transistor 102, and the transistor 25.

In this case, in the storage element 92, the current (store current) flows from the pinned layer (P layer) connected to the node N13 side to the free layer (F layer) connected to the control line L11 side, so that the storage element 92 becomes the high resistance state, i.e., the AP state.

As a result, the "L" level state held in the storage node N11 is inverted by the store driver 22 and will be held in the storage element 92. In other words, the "L" level state held in the storage node N11 is inverted and written to the storage element 92.

After the voltage level state in the storage node N11 and the storage node N12 is stored in the storage element 92 and the storage element 91 in this way, the control signal CTRL is set to the "L" level and the store operation ends.

In the store operation described above, the store current flows through the path, for example, illustrated in FIG. 2. In FIG. 2, parts corresponding to those in FIG. 1 are given the same reference signs to omit the description thereof as appropriate.

The example in FIG. 2 illustrates the path of the store current during the above-described store operation (hereinafter, also referred to as the store path).

A polygonal line LN11 indicates the store path at the time of storing information (state) in the storage element 91 at the timing that the control signal CTRL is set to the "L" level.

The transistor 101, the storage element 91, the transistor 82, and the transistor 17 are arranged on the store path indicated by this polygonal line L21.

On the other hand, a polygonal line LN12 indicates the store path at the time of storing information (state) in the storage element 92 at the timing that the control signal CTRL is set to the "H" level. The transistor 71, the storage element 92, the transistor 102, and the transistor 25 are arranged on the store path indicated by this polygonal line L22.

For example, WO 2016/185903 A (hereinafter, also referred to as Patent Literature 1) proposes an NVDFF circuit in which the store path and the restore path are different from each other.

In such an NVDFF circuit, the transistor 14, the transistor 25, the transistor 25, and the OR circuit 24 in the NVDFF circuit 10 are not provided. Further, in the NVDFF circuit, transistors are provided on the store path at positions corresponding to between the store driver 12 and the storage element 92 and between the store driver 15 and the storage element 91.

In this case, one of these two transistors always has a source connection in which the MTJ is connected to the ground side of the transistor.

Therefore, when the store current flows through the MTJ via the transistor having the source connection, the store current becomes small due to a back bias effect. Therefore, in order to secure a sufficiently large store current, a gate width of the transistor needs to be widened. This results in increasing a circuit size.

On the other hand, in the NVDFF circuit 10, the transistor 23, the transistor 17, and the transistor 25 are provided between the ground and each of the store driver 12, the store driver 15, and the control driver 23.

Therefore, in the NVDFF circuit 10, it is not necessary to provide a transistor between the store driver 12 and the storage element 92, or between the store driver 15 and the storage element 91.

As a result, in the NVDFF circuit 10, no transistors have the source connection in the store path, and all the transistors in the store path have a drain connection in which the storage element is connected to the transistor on a side opposite to the ground side.

Specifically, for example, the transistor 17 arranged in the store path indicated by the polygonal line LN11 also has the drain connection in which the storage element 92 is connected to the drain side. Further, when the store current flows through the transistor 14 at the time of storage, the store current flows from the storage element 92 to the ground via the transistor 14. Therefore, the transistor 14 has the drain connection.

Similarly, the transistor 25 arranged in the store path indicated by the polygonal line LN12 has the drain connection in which the storage element 91 is connected to the drain side (power supply side).

Therefore, in the NVDFF circuit 10, the store current does not become small due to the back bias effect. As a result, a sufficient store current can be secured even when a transistor having a narrow gate width is used. Accordingly, the circuit size of the entire NVDFF circuit 10 can be suppressed to a small size.

Moreover, the NVDFF circuit 10 has a structure in which the store driver receives the voltage level of the storage node of the slave latch 45 at the time of storage, and its output is written in the storage element via a path that does not affect the voltage level of the storage node. Therefore, a latchup breakdown does not occur. In other words, stable writing can be performed.

From these facts, according to the NVDFF circuit 10, the NVDFF circuit 10 small in size with low power consumption can be achieved while maintaining stable writing.

Returning to the description of the operation of the NVDFF circuit 10, when the states of the storage node N12 and the storage node N11 are stored in the storage element 91 and the storage element 92 in the store mode, the mode transitions to the sleep mode at an appropriate timing.

In the sleep mode, the power switch (not illustrated) is turned off to shut off the power supply to the NVDFF circuit 10. As a result, the voltage level on the output side of the inverter 46 becomes the "L" level.

Then, when returning from the sleep state, the operation in the restore mode (restore operation) is performed.

In the restore mode, the restore control signal SR1 is set to the "H" level and the transistor 18 and the transistor 19 are turned on.

At this time, since the store control signal SR2 is set to the "L" level, the transistor 14 and the transistor 17 are turned off (non-conducting state). Further, the inverter 21 and the inverter 22 output the "H" level, and the transistor 13 and the transistor 16 are also turned off (non-conducting state).

Therefore, the store driver 12 and the store driver 15 become a state that power is not supplied.

At this time, since the restore control signal SR1 is at the "H" level and the store control signal SR2 is at the "L" level, the OR circuit 24 outputs the "H" level, and the transistor 25 is turned on.

Furthermore, the control signal CTRL is set to the "H" level, the transistor 102 of the control driver 23 is turned on, and the control line L11 is connected to the ground. In other words, the control line L11 becomes the "L" level.

Figure 3:
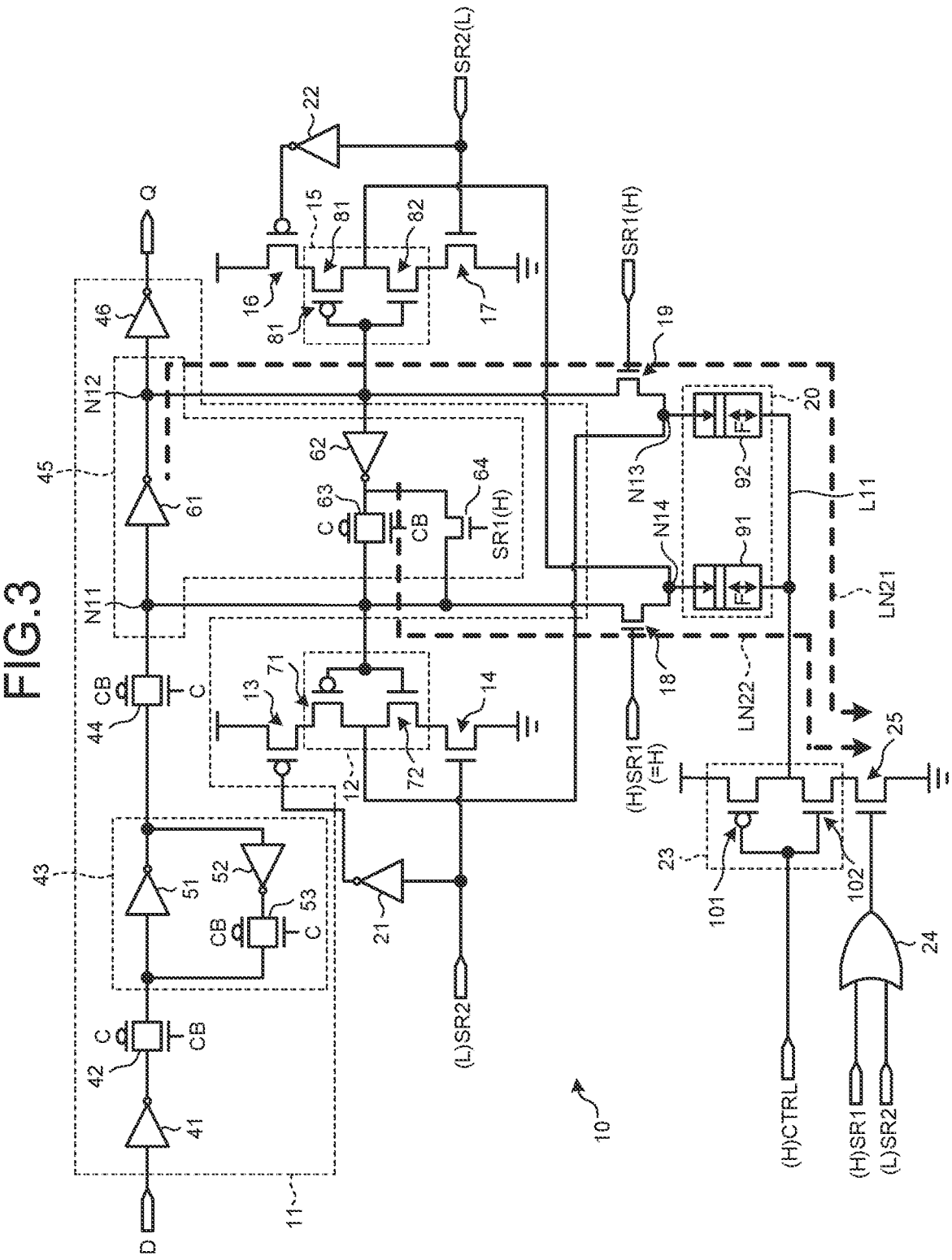
FIG. 3 is an explanatory diagram of a restore path.

FIG. 3 is an explanatory diagram of the restore path.

In this condition, when the power switch (not illustrated) is turned on, as illustrated in FIG. 3, the restore current flows from a side of the slave latch 45 to which the power supply voltage is supplied to the control line L11 via the storage element 91 and the storage element 92.

Here, as in the above example, it is supposed that the storage element 91 is in the low resistance state, i.e., the P state, and the storage element 92 is in the high resistance state, i.e., the AP state.

In this case, as illustrated in FIG. 3, the restore current flows through two paths of the polygonal line LN21 and the polygonal line LN22 (hereinafter referred to as the restore path).

The restore path indicated by the polygonal line LN21 is a path through which the restore current flows from the inverter 61 to the ground via the transistor 19, the node N13, the storage element 92, the control line L11, the transistor 102, and the transistor 25.

The restore path indicated by the polygonal line LN22 is a path through which the restore current flows from the inverter 62 to the ground via the transmission gate 63, the transistor 18, the node N14, the storage element 91, the control line L11, the transistor 102, and the transistor 25.

When the restore current flows in each of the restore paths LN21 and LN22 in this way, the voltage of the node N13 rises higher than the voltage of the node N14 due to a difference in electrical resistance between the storage element 91 and the storage element 92.

Then, conductance of the transistor 19 significantly reduces, as compared with the transistor 18, due to increased source voltage. Therefore, the current flowing through the transistor 19 becomes smaller than the current flowing through a transistor 26, which is larger than the difference between the resistances of the storage element 91 and the storage element 92.

As a result, the voltage of the storage node N12 rises above the voltage of the storage node N11. The storage node N12 becomes the power supply voltage ("H" level), and the storage node N11 becomes the ground level ("L" level) due to a positive feedback applied by a loop of the inverter 61 and the inverter 62 in the slave latch 45. In other words, a state same as the voltage level state of the storage node N11 and the storage node N12 at the time of storage is restored.

For example, in the NVDFF circuit described in Patent Literature 1, elements corresponding to the transistor 13, the transistor 14, the transistor 16, and the transistor 17 in the NVDFF circuit 10 are not provided. On the other hand, in the NVDFF circuit 10, the transistor 13, the transistor 14, the transistor 16, and the transistor 17 are provided so as to avoid wasteful power consumption at the time of restoration.

For example, it is supposed that the transistor 13 and the transistor 14 are not provided in the NVDFF circuit 10. In this case, when the restore current flows from the inverter 62 to the ground via the transmission gate 63, the transistor 18, the node N14, the storage element 91, the control line L11, the transistor 102, and the transistor 25 at the time of restoration, the input end of the store driver 12 will have an intermediate voltage between the power supply voltage and the ground level, and both the transistor 71 and the transistor 72 are turned on.

Then, in the store driver 12, a large current flows from the power supply to the ground via the transistor 71 and the transistor 72. As a result, the power consumption increases.

However, in reality, the NVDFF circuit 10 is provided with the transistor 13 and the transistor 14. During the restore operation, the transistor 13 and the transistor 14 are turned off. Therefore, in the store driver 12, unnecessary current does not flow from the power supply to the ground. In other words, as illustrated in FIG. 3, the restore current flows from the inverter 61 to the ground via the transistor 19, the node N13, the storage element 92, the control line L11, the transistor 102, and the transistor 25.

Therefore, even when the input end of the store driver 12 becomes the intermediate voltage between the power supply voltage and the ground level at the time of restoration, the transistor 71 and the transistor 72 are electrically separated. Therefore, the restore current does not flow via the transistor 71 and the transistor 72.

A case similar to the case of the store driver 12 also occurs in the store driver 15. In other words, in the store driver 15, as illustrated in FIG. 3, the restore current flows from the power supply to the ground via the transistor 81, the node N14, the storage element 91, the control line L11, the transistor 102, and the transistor 25.

Similarly, in the embodiment, the transistor 16 and the transistor 17 are provided, and the transistor 16 and the transistor 17 are turned off during the restore operation. Therefore, also for the store driver 15, unnecessary current does not flow from the power supply to the ground. At this time, as illustrated in FIG. 3, the restore current flows from the inverter 62 to the ground via the transmission gate 63, the transistor 18, the node N14, the storage element 91, the control line L11, the transistor 102, and the transistor 25.

Therefore, in the NVDFF circuit 10 in the first embodiment, no wasteful restore current flows even when the input ends of the store driver 12 and the store driver 15 have the intermediate voltage between the power supply voltage and the ground level. Accordingly, power consumption can be reduced.

After restoration is completed as described above, the operation of each of the active mode, the store mode, the sleep mode, and the restore mode described above is performed according to the storage data input.

As described above, according to the NVDFF circuit 10, it is possible to downsize and keep power consumption low while maintaining stable writing.

[2] Second Embodiment

In the first embodiment described above, an example of applying the present technique to the NVDFF circuit of the header type SSR-NVFF circuit system has been described. In the second embodiment, the present technique is also applied to an NVDFF circuit of a footer type SSR-NVFF circuit system.

Figure 4:
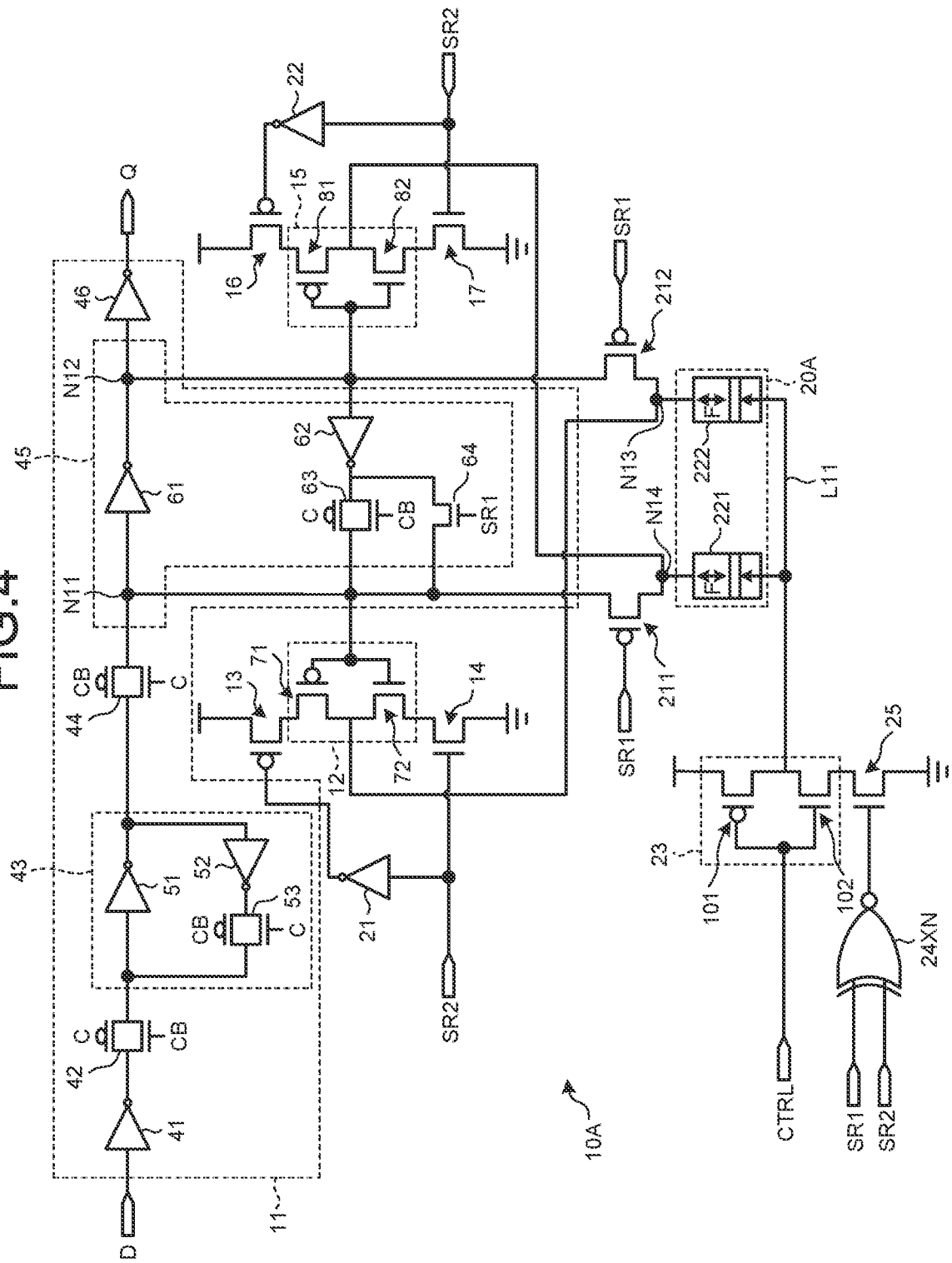
FIG. 4 is a diagram illustrating a configuration example of an NVDFF circuit of a footer type SSR-NVFF circuit system according to a second embodiment.

FIG. 4 is a diagram illustrating a configuration example of the NVDFF circuit of the footer type SSR-NVFF circuit system of the second embodiment. In FIG. 4, the same parts as those in the first embodiment in FIG. 1 are given the same reference signs, and the description will be referred thereto as appropriate.

An NVDFF circuit 10A of the second embodiment differs from the NVDFF circuit 10 of the first embodiment in that the transistor 18, the transistor 19, the non-volatile storage unit 20, and the OR circuit 24 are replaced with a transistor 211, a transistor 212, a non-volatile storage unit 20A, and an XNOR circuit 24XN.

In the NVDFF circuit 10A illustrated in FIG. 4, an N-channel MOSFET is used as a power switch in the PG. Specifically, for example, when the power switch is turned on, each part of the NVDFF circuit 10A is connected to the ground via the N-channel MOSFET. Further, when the power switch is turned off, each part of the NVDFF circuit 10 is electrically disconnected from the ground. In other words, PG is achieved.

Further, the non-volatile storage unit 20A includes a storage element 221 and a storage element 222 configured as the MTJ.

In the NVDFF circuit 10A, the transistor 211 is provided between the storage node N11 and the node N14. Further, in the NVDFF circuit 10A, the transistor 212 is provided between the storage node N12 and the node N13. These transistors 211 and 212 are P-channel MOSFETs, and the control signal SR1 is supplied to the gates of the transistor 211 and the transistor 212.

Here, the pinned layer (P layer) of the storage element 221 is connected to the control line L11, and the free layer (F layer) of the storage element 221 is connected to the node N14. Further, the pinned layer (P layer) of the storage element 222 is connected to the control line L11, and the free layer (F layer) of the storage element 222 is connected to the node N13.

Also in the NVDFF circuit 10A of the second embodiment, as in the first embodiment, all the transistors in the store path have the drain connection.

Specifically, the transistor 18 and the transistor 19 arranged in the store path have the drain connection in which the storage element 221 and the storage element 222 are connected to the drain side. Similarly, the transistor 25 arranged in the store path also has the drain connection in which the storage element 221 and the storage element 222 are connected to the drain side.

Further, the control signal SR1 and the control signal SR2 are supplied to an input end of the XNOR circuit 24XN, and an output end of a XNOR circuit 24N is connected to the transistor 25.

Next, the operation of the NVDFF circuit 10A of the second embodiment will be described.

In the NVDFF circuit 10A of the second embodiment, the same operation as that of the first embodiment described above is performed in the active mode.

Further, in the store mode, the restore control signal SR1 is set to the "H" level, and the transistor 211 and the transistor 212 are turned off.

At this time, since the store control signal SR2 is set to the "H" level, the transistor 14 and the transistor 17 are turned on (conducting state). Further, the inverter 21 and the inverter 22 output the "L" level, and the transistor 13 and the transistor 16 are also turned on (conducting state).

Therefore, the store driver 12 and the store driver 15 become a state that power is supplied.

Further, an output of the XNOR circuit 24XN to which the control signal SR1 and the control signal SR2 are supplied becomes the "H" level, and the transistor 25 is turned on.

Further, for example, when the control signal CTRL is set to the "H" level and then the control signal CTRL is set to the L level, states of the storage nodes N11 and N12 are stored in the non-volatile storage unit 20A.

In other words, for example, it is supposed that the state of the storage node N11 is at the "L" level and the state of the storage node N12 is at the "H" level.

In this condition, the transistor 71 of the store driver 12 is turned on and the node N13 becomes the "H" level. The transistor 82 of the store driver 15 is turned on and the node N14 becomes the "L" level.

Here, when the control signal CTRL is set to the "H" level and the control line L11 becomes the "L" level, the store current flows from the node N13 side to the control line L11 side in the storage element 222, and the storage element 222 becomes a low resistance state (P state). As a result, the voltage level state of the storage node N11 is held (stored) in the storage element 222 as it is by the store driver 12.

When the control signal CTRL is set to the "L" level and the control line L11 becomes the "H" level, the store current flows from the control line L11 side to the node N14 side in the storage element 221, and the storage element 221 becomes a high resistance state (AP state). As a result, the voltage level state of the storage node N12 is held (stored) in the storage element 221 as it is by the store driver 15.

In the NVDFF circuit 10A of the second embodiment, as in the first embodiment, the transistors with the source connection are not arranged in the store path, and all the transistors in the store path have the drain connection. Specifically, the transistor 18, the transistor 19, and the transistor 25 have the drain connection.

When the operation in the store mode ends and the mode transitions to the sleep mode, the power switch (not illustrated) is turned off and the PG is achieved. Then, when returning from the sleep state, the operation in the restore mode is performed.

In the restore mode, the restore control signal SR1 is set to the "L" level and the transistor 211 and the transistor 212 are turned on.

At this time, since the store control signal SR2 is set to the "L" level, the transistor 14 and the transistor 17 are turned off (non-conducting state). Further, the inverter 21 and the inverter 22 output the "H" level, and the transistor 13 and the transistor 16 are also turned off (non-conducting state).

Therefore, the store driver 12 and the store driver 15 become a state that power is not supplied.

At this time, since the restore control signal SR1 is at the "L" level and the store control signal SR2 is at the "L" level, the XNOR circuit 24N outputs the "H" level, and the transistor 25 is turned on.

Furthermore, the control signal CTRL is set to the "L" level, the transistor 101 of the control driver 23 is turned on, and the control line L11 is connected to the power supply. In other words, the control line L11 becomes the "H" level.

In this state, when the power switch (not illustrated) is turned on, restore current will flow. Here, as in the above example, it is supposed that the storage element 221 is in the high resistance state (AP state) and the storage element 222 is in the low resistance state (P state).

By the way, since the current path to the ground is shut off in the sleep state, the voltage of the node inside the circuit rises to a voltage close to the power supply voltage due to leakage. Then, when the power switch (not illustrated) is turned on, a ground voltage is supplied to the slave latch 45. As a result, the restore current flows from the control line L11 to the slave latch 45 side via the storage element 221 and the storage element 222.

In this example, the storage element 221 is in the high resistance state (AP state), and the storage element 222 is in the low resistance state (P state). Therefore, when the restore current flows, the voltage of the node N14 decreases more than the voltage of the node N13 due to a difference in electrical resistance between the storage element 221 and the storage element 222.

Therefore, conductance of the transistor 211 significantly reduces, as compared with the transistor 212, due to decreased source voltage. As a result, current flowing through the transistor 211 becomes smaller than the current flowing through the transistor 212, which is greater than a difference in resistance between the storage element 221 and the storage element 222.

As a result, the voltage of the storage node N11 decreases more than the voltage of the storage node N12, and a positive feedback is applied by a loop of the inverter 61 and the inverter 62 in the slave latch 45. Therefore, the storage node N12 becomes the power supply voltage ("H" level), and the storage node N11 becomes the ground level ("L" level). In other words, a state same as the voltage level state of the storage node N11 and the storage node N12 at the time of storage is restored.

In this case, the transistor 13, the transistor 14, the transistor 16, and the transistor 17 are turned off, as in the case of the first embodiment. Therefore, the restore current does not flow from the power supply to the ground via the transistor 13, the transistor 14, the transistor 16, and the transistor 17. Accordingly, wasteful power consumption is suppressed.

After restoration is completed, the operation of each of the active mode, the store mode, the sleep mode, and the restore mode is performed according to the storage data input.

As described above, also in the second embodiment, it is possible to downsize and keep power consumption low while maintaining stable writing, same as the first embodiment.

[2.1] Modification of Second Embodiment

Figure 5:
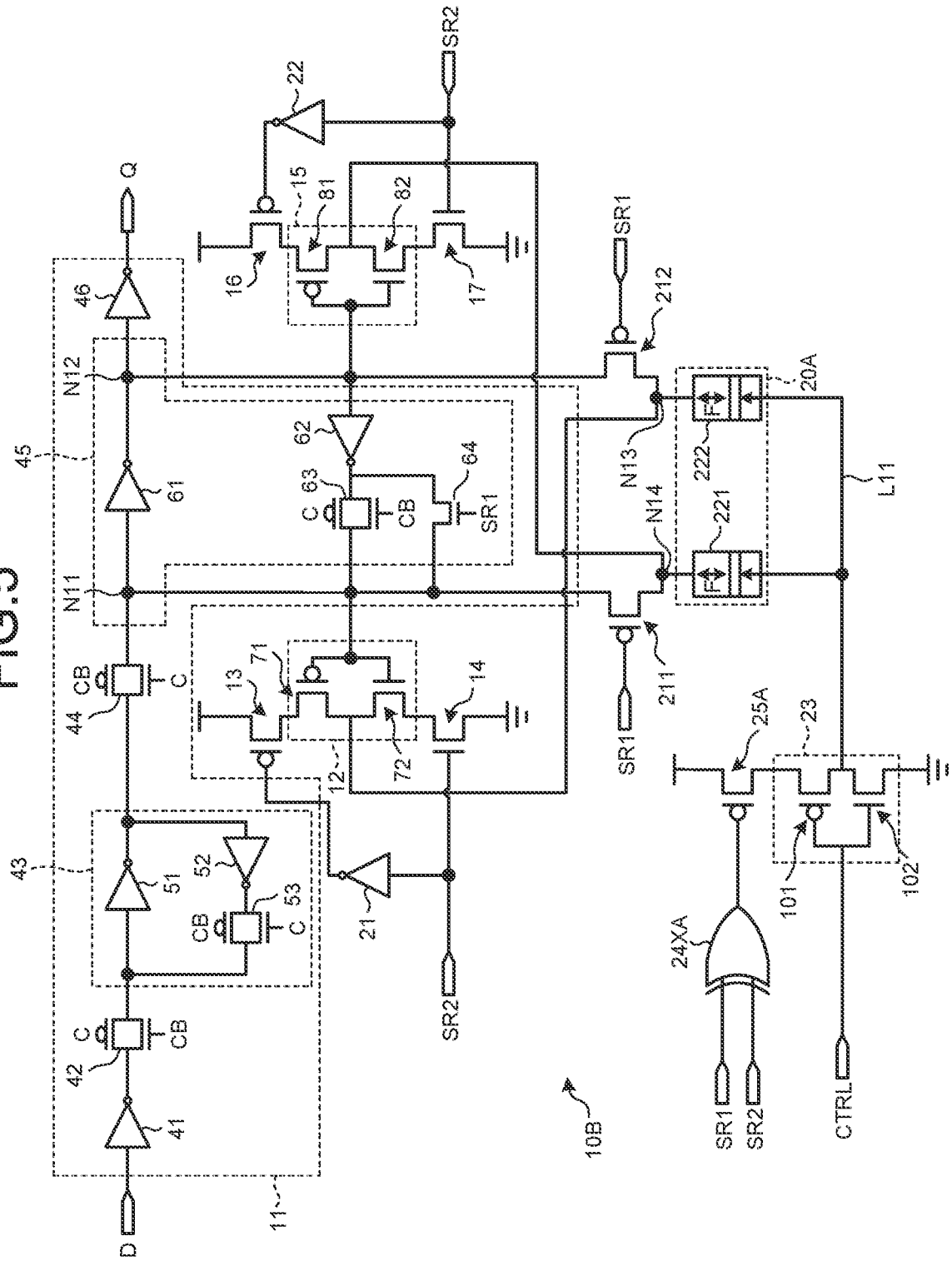
FIG. 5 is an explanatory diagram of modification of the second embodiment.

FIG. 5 is an explanatory diagram of modification of the second embodiment. In FIG. 5, the same parts as those in the second embodiment in FIG. 4 are given the same reference signs, and the description will be referred thereto as appropriate.

An NVDFF circuit 10B of the modification of the second embodiment differs from the NVDFF circuit 10A of the second embodiment in that the NVDFF circuit 10B is provided with a transistor 25A configured as a P-channel MOSFET in which one terminal is connected to a power supply, an XOR circuit 24XA that outputs a control signal to a gate of the transistor 25A, and the control driver 23 in which one terminal of the transistor 101 is connected to the other terminal of the transistor 25A and one terminal of the transistor 102 is connected to the ground.

Next, the operation of the modification of the second embodiment will be described.

In the modification of the second embodiment, the same operation as that of the first embodiment is performed in the active mode, as in the second embodiment.

Further, in the store mode, the restore control signal SR1 is set to the "H" level, and the transistor 211 and the transistor 212 are turned off.

At this time, since the store control signal SR2 is set to the "H" level, the transistor 14 and the transistor 17 are turned on (conducting state). Further, the inverter 21 and the inverter 22 output the "L" level, and the transistor 13 and the transistor 16 are also turned on (conducting state).

Therefore, the store driver 12 and the store driver 15 become a state that power is supplied.

Further, the XOR circuit 24XA to which the control signal SR1 and the control signal SR2 are supplied outputs the "L" level, and the transistor 25A is turned on.

Further, for example, when the control signal CTRL is set to the "H" level and then the control signal CTRL is set to the "L" level, states of the storage nodes N11 and N12 are stored in the non-volatile storage unit 20A.

In other words, for example, it is supposed that the state of the storage node N11 is at the "L" level and the state of the storage node N12 is at the "H" level.

In this condition, the transistor 71 of the store driver 12 is turned on and the node N13 becomes the "H" level. The transistor 82 of the store driver 15 is turned on and the node N14 becomes the "L" level.

Here, when the control signal CTRL is set to the "H" level and the control line L11 becomes the "L" level, the store current flows from the node N13 side to the control line L11 side in the storage element 222, and the storage element 222 becomes a low resistance state (P state). As a result, the voltage level state of the storage node N11 is held (stored) in the storage element 222 as it is by the store driver 12.

When the control signal CTRL is set to the "L" level and the control line L11 becomes the "H" level, the store current flows from the control line L11 side to the node N14 side in the storage element 221, and the storage element 221 becomes a high resistance state (AP state). As a result, the voltage level state of the storage node N12 is held (stored) in the storage element 221 as it is by the store driver 15.

Also in the modification of the second embodiment, as in the first embodiment, transistors with the source connection are not arranged in the store path, and all the transistors in the store path have the drain connection. Specifically, the transistor 18, the transistor 19, and the transistor 25A have the drain connection.

When the operation in the store mode ends and the mode transitions to the sleep mode, the power switch (not illustrated) is turned off and the PG is achieved. Then, when returning from the sleep state, the operation in the restore mode is performed.

In the restore mode, the restore control signal SR1 is set to the "L" level and the transistor 211 and the transistor 212 are turned on.

At this time, since the store control signal SR2 is set to the "L" level, the transistor 14 and the transistor 17 are turned off (non-conducting state). Further, the inverter 21 and the inverter 22 output the "H" level, and the transistor 13 and the transistor 16 are also turned off (non-conducting state).

Therefore, the store driver 12 and the store driver 15 become a state that power is not supplied.

At this time, since the restore control signal SR1 is at the "L" level and the store control signal SR2 is at the "L" level, a XNOR circuit 24NA outputs the "L" level and the transistor 25A is turned on.

Furthermore, the control signal CTRL is set to the "L" level, the transistor 101 of the control driver 23 is turned on, and the control line L11 is connected to the power supply. In other words, the control line L11 becomes the "H" level.

In this state, when the power switch (not illustrated) is turned on, restore current will flow. Here, as in the above example, it is supposed that the storage element 221 is in the high resistance state (AP state) and the storage element 222 is in the low resistance state (P state).

By the way, since the current path to the ground is shut off in the sleep state, the voltage of the node inside the circuit rises to a voltage close to the power supply voltage due to leakage. Then, when the power switch (not illustrated) is turned on, a ground voltage is supplied to the slave latch 45. As a result, the restore current flows from the control line L11 to the slave latch 45 side via the storage element 221 and the storage element 222.

In this example, since the storage element 221 is in the high resistance state (AP state) and the storage element 222 is in the low resistance state (P state), the voltage of the node N14 decreases more than the voltage of the node N13 due to a difference in electrical resistance between the storage element 221 and the storage element 222 when the restore current flows.

Therefore, conductance of the transistor 211 significantly reduces, as compared with the transistor 212, due to decreased source voltage. As a result, current flowing through the transistor 211 becomes smaller than the current flowing through the transistor 212, which is greater than a difference in resistance between the storage element 221 and the storage element 222.

As a result, the voltage of the storage node N11 decreases more than the voltage of the storage node N12, and a positive feedback is applied by a loop of the inverter 61 and the inverter 62 in the slave latch 45. Therefore, the storage node N12 becomes the power supply voltage ("H" level), and the storage node N11 becomes the ground level ("L" level). In other words, a state same as the voltage level state of the storage node N11 and the storage node N12 at the time of storage is restored.

In this case, same as the first embodiment and the second embodiment, since the transistor 13, the transistor 14, the transistor 16, and the transistor 17 are turned off, the restore current does not flow from the power supply to the ground via the transistor 13, the transistor 14, the transistor 16, and the transistor 17. Accordingly, wasteful power consumption is suppressed.

After restoration is completed, the operation of each of the active mode, the store mode, the sleep mode, and the restore mode is performed according to the storage data input.

As described above, also in the modification of the second embodiment, it is possible to downsize and keep power consumption low while maintaining stable writing, same as the first embodiment.

[3] Third Embodiment

In the first and second embodiments described above, examples of applying the present technique to the NVDFF circuit of the header or footer type SSR-NVFF circuit system have been described. The third embodiment gives an example of an NVDFF circuit of a header type SSR-NVFF circuit system having a verify function.

Figure 6:
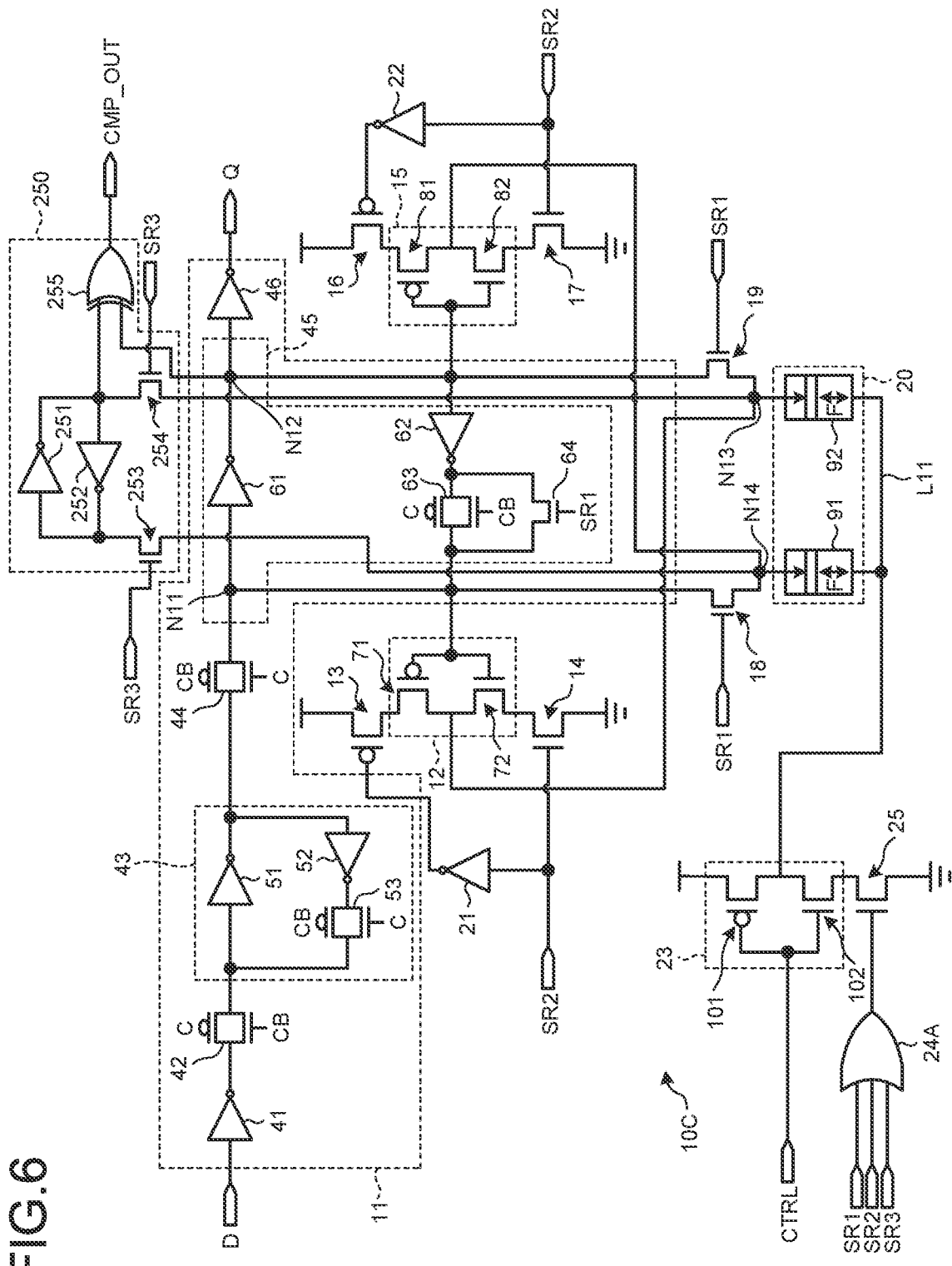
FIG. 6 is a diagram illustrating a configuration example of an NVDFF circuit of a header type SSR-NVFF circuit system having a verify function according to a third embodiment.

FIG. 6 is a diagram illustrating a configuration example of the NVDFF circuit of the header type SSR-NVFF circuit system having the verify function according to the third embodiment. In FIG. 6, the same parts as those in the first embodiment in FIG. 1 are given the same reference signs, and the description will be referred thereto as appropriate.

An NVDFF circuit 10C of the third embodiment differs from the first embodiment in that a three-input OR circuit 24A is provided instead of the OR circuit 24, and the restore control signal SR1, the store control signal SR2, and a verify restore control signal SR3 are input. Still more, the NVDFF circuit 10C is equipped with a comparison unit 250 that determines whether or not correct writing is performed when the verify restore control signal SR3 is input.

Next, a configuration of the comparison unit 250 will be described.

The comparison unit 250 includes an inverter 251, an inverter 252, a transistor 253, a transistor 254, and an XOR circuit 255.

An input of the inverter 251 is connected to one terminal of the transistor 253 in which the verify restore control signal SR3 is input to a gate terminal. An output of the inverter 251 is connected to an input terminal of the inverter 252 and one terminal of the transistor 253 in which the verify restore control signal SR3 is input.

An output of the inverter 252 is connected to the input of the inverter 251 and cooperates with the inverter 251 to configure a latch circuit.

The other terminal of the transistor 253 is connected to the node N14. Further, the other terminal of the transistor 254 is connected to the node N13.

One terminal of the XOR circuit 255 is connected to the output of the inverter 251 and the other terminal of the XOR circuit 255 is connected to the storage node N12. When written data and actually written data do not match, an "H" level signal is output.

Next, the operation in the third embodiment will be described.

Since the operation at the time of storage and the operation at the time of restoration are the same as those in the first embodiment, the operation at the time of verify restore will be described.

Prior to performing the verify restore operation, it is assumed that the data has been written by the store operation.

In the verify restore mode, the restore control signal SR1 is set to the "L" level and the transistor 18 and the transistor 19 are turned off. In other words, the transistor 18 and the transistor 19 become the non-conducting state.

At this time, since the store control signal SR2 is also set to the "L" level, the transistor 14 and the transistor 17 are turned off (non-conducting state). Further, the inverter 21 and the inverter 22 output the "H" level, and the transistor 13 and the transistor 16 are also turned off (non-conducting state).

Therefore, the store driver 12 and the store driver 15 become a state that power is supplied.

On the other hand, since the verify restore control signal SR3 is set to the "H" level, the OR circuit 24A to which the restore control signal SR1, the store control signal SR2, and the verify restore control signal SR3 are supplied (input) outputs the "H" level. Therefore, the transistor 25 in which the output of the OR circuit 24A at the "H" level is supplied to the gate is turned on.

In addition, the transistor 253 and the transistor 254 in which the "H" level is supplied to the gates are also turned on.

Then, in a period until the transistor 253 and the transistor 254 are turned off, a loop of the inverter 251 and the inverter 252 holds (stores) a level indicating the storage data of the node N13 and the node N14.

As a result, the output of the inverter 251, i.e., a level in which the storage data of the node N14 is inverted, is input to one input terminal of the XOR circuit 255.

Further, a signal level stored in the storage node N12 is input to the other input terminal of the XOR circuit 255. At this time, when writing is correctly performed, the storage data stored in the storage node N12 is equal to inverted data of the storage data in the node N14. Therefore, the output of the XOR circuit 255 becomes the "L" level.

On the other hand, when writing is not correctly performed, the storage data stored in the storage node N12 is not equal to the inverted data of the storage data in the node N14. In other words, the XOR circuit 255 outputs the "H" level.

Therefore, it can be easily determined whether or not the writing is correctly performed according to the output of the XOR circuit 255.

Further, as in the first embodiment, even when the input ends of the store driver 12 and the store driver 15 have an intermediate voltage between the power supply voltage and the ground level, wasteful restore current does not flow and power consumption can be reduced. Accordingly, the verify restore operation improves reliability of the store operation, and it is possible to downsize and keep power consumption low while maintaining stable writing.

[4] Fourth Embodiment

In the third embodiment described above, the present technique applied to the NVDFF circuit of the header type SSR-NVFF circuit system having the verify function has been described. In the fourth embodiment, the present technique is applied to an NVDFF circuit of a footer type SSR-NVFF circuit system having a verify function.

Figure 7:
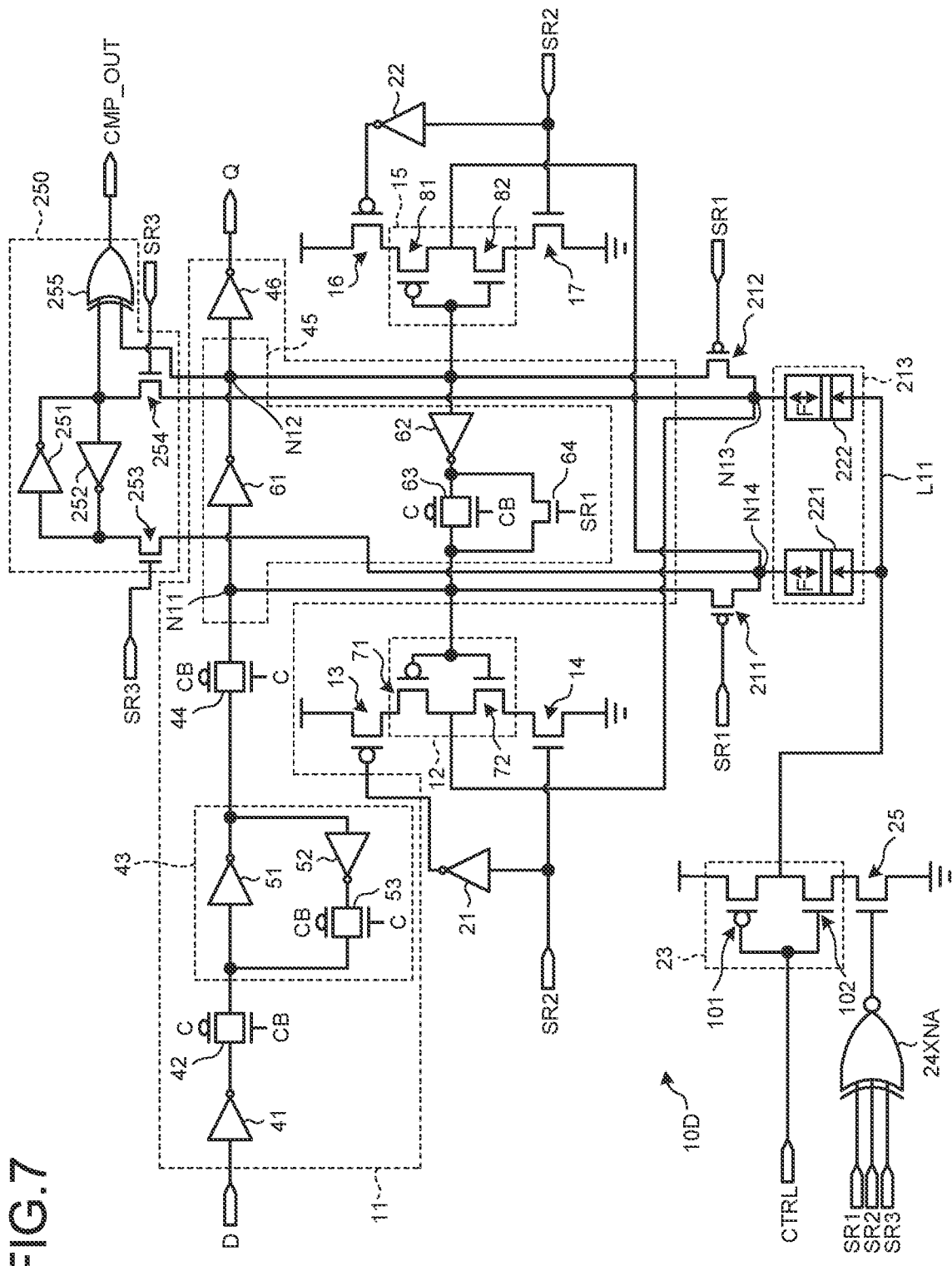
FIG. 7 is a diagram illustrating a configuration example of an NVDFF circuit of a footer type SSR-NVFF circuit system having a verify function according to a fourth embodiment.

FIG. 7 is a diagram illustrating a configuration example of the NVDFF circuit of the footer type SSR-NVFF circuit system having the verify function according to the fourth embodiment. In FIG. 7, the same parts as those in the third embodiment of FIG. 6 are given the same reference signs, and the description of will be referred thereto as appropriate.

An NVDFF circuit 10D of the fourth embodiment differs from the third embodiment in that a three-input XNOR circuit 24XNA is provided instead of the OR circuit 24, and the restore control signal SR1, the store control signal SR2, and the verify restore control signal SR3 are input.

According to the configurations, the store operation and the restore operation are the same as those in the second embodiment, and the verify restore operation is the same as the third embodiment.

Therefore, also in the fourth embodiment, as in the third embodiment, even when the input ends of the store driver 12 and the store driver 15 become the intermediate voltage between the power supply voltage and the ground level, wasteful restore current does not flow and power consumption can be reduced. Accordingly, the verify restore operation improves reliability of the store operation, and it is possible to downsize and keep power consumption low while maintaining stable writing.

[5] Fifth Embodiment

Figure 8:
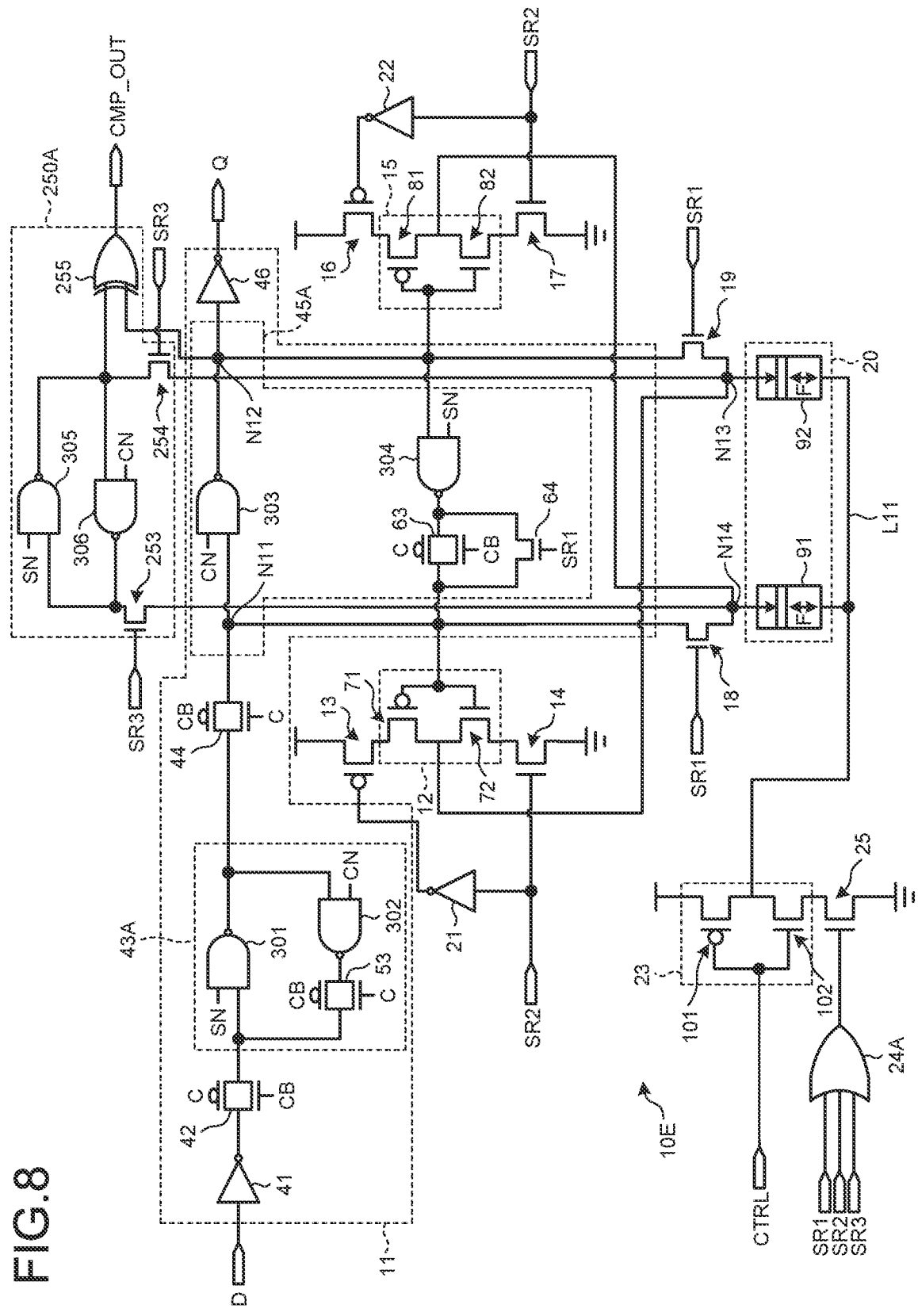
FIG. 8 is a diagram illustrating a configuration example of an NVDFF circuit of a header type SSR-NVFF circuit system having a verify function and a set/reset function.

FIG. 8 is a diagram illustrating a configuration example of an NVDFF circuit of a header type SSR-NVFF circuit system having a verify function and a set/reset function.

In FIG. 8, the same parts as those in the first embodiment in FIG. 1 are given the same reference signs.

An NVDFF circuit 10E illustrated in FIG. 8 includes the volatile storage unit 11, the store driver 12, the transistor 13, the transistor 14, the store driver 15, the transistor 16, the transistor 17, the transistor 18, the transistor 19, the non-volatile storage unit 20, the inverter 21, the inverter 22, the control driver 23, the three-input OR circuit 24A, the transistor 25, and a comparison unit 250A.

Here, the transistor 13 and the transistor 16 are P-channel MOSFETs. Further, the transistor 14, the transistor 17, the transistor 18, the transistor 19, and the transistor 25 are N-channel MOSFETs.

The volatile storage unit 11 includes the inverter 41, the transmission gate 42, a master latch 43A, the transmission gate 44, a slave latch 45A, and the inverter 46. A difference with the volatile storage unit 11 in the first embodiment is a configuration of the master latch 43A and the slave latch 45A. These will be described, and the description of the first embodiment will be referred to for others.

The master latch 43A includes a NAND circuit 301, a NAND circuit 302, and the transmission gate 53.

Further, the slave latch 45A includes a NAND circuit 303, a NAND circuit 304, the transmission gate 63, and a transistor (N-channel MOSFET) 64.

In the volatile storage unit 11, an input side of the inverter 41 is an input terminal of the volatile storage unit 11, and an output side of the inverter 41 is connected to one input terminal of the NAND circuit 301 via the transmission gate 42. A set signal SN is input to the other input terminal of the NAND circuit 301, and the storage node N11 of the slave latch 45 is connected to an output terminal of the NAND circuit 301 via the transmission gate 44, and the output terminal of the NAND circuit 301 is connected to one input terminal of the NAND circuit 302.

A reset signal CN is input to the other input terminal of the NAND circuit 302, and the output terminal of the NAND circuit 302 is connected to one input terminal of the NAND circuit 301 via the transmission gate 53. In other words, the output of the NAND circuit 302 is connected between the NAND circuit 301 and the transmission gate 42 via the transmission gate 53.

The slave latch 45A has the storage node N11 and the storage node N12 that temporarily hold a voltage level corresponding to storage data input. The NAND circuit 303 is provided between the storage node N11 and the storage node N12, and the storage node N11 is connected to one input terminal of the NAND circuit 303.

The reset signal CN is input to the other input terminal of the NAND circuit 303, and the output terminal of the NAND circuit 303 is connected to the storage node N12.

Further, the storage node N12 is connected to one input terminal of the NAND circuit 304.

The set signal SN is input to the other input terminal of the NAND circuit 304, and the output terminal of the NAND circuit 304 is connected to the storage node N11 via the transmission gate 63. Further, the transistor 64, which is the N-channel MOSFET, is connected to both ends of the transmission gate 63. In other words, one end of the transistor 64 is connected to the input side of the transmission gate 63, and the other end of the transistor 64 is connected to the output side of the transmission gate 63. A restore control signal SR1 having a predetermined voltage level is supplied to a gate of the transistor 64.

In the three-input OR circuit 24A, the restore control signal SR1, the store control signal SR2, and the verify restore control signal SR3 are input, and their logic sum is input to the gate of the transistor 25.

The comparison unit 250A determines whether or not writing has been performed correctly when the verify restore control signal SR3 is input.

Here, a configuration of the comparison unit 250A will be described.

The comparison unit 250A includes a NAND circuit 305, a NAND circuit 306, the transistor 253, the transistor 254, and the XOR circuit 255.

One input terminal of the NAND circuit 305 is connected to one terminal of the transistor 253 in which the verify restore control signal SR3 is input to the gate. The set signal SN is input to the other input terminal of the NAND circuit 305, and the output terminal of the NAND circuit 304 is connected to one terminal of the transistor 253 in which the verify restore control signal SR3 is input to one input terminal and the gate terminal of the NAND circuit 306.

The output terminal of the NAND circuit 306 is connected to one input terminal of the NAND circuit 305.

The other terminal of the transistor 253 is connected to the node N14. Further, the other terminal of the transistor 254 is connected to the node N13.

One terminal of the XOR circuit 255 is connected to the output terminal of the NAND circuit 305 and the other terminal is connected to the storage node N12. When the written data and the actually written data do not match, the H "level signal is output.

Next, the operation of the fifth embodiment will be described.

First, the set signal SN and the reset signal CN will be described prior to the description of the detailed operation.

Combinations of the set signal SN and the reset signal CN in the NVDFF circuit 10E of the fifth embodiment are three according to the three operation modes.

The operation modes are a normal mode, a set mode, and a reset mode, and there are three combinations of the set signal SN and the reset signal CN as shown below.

Normal mode: SN="H", CN="H"
Set mode: SN="L", CN="H"
Reset mode: SN="H", CN="L"

First, the operations of the master latch 43A, the slave latch 45A, and the comparison unit 250A will be mainly described in the normal mode.

When the set signal SN="H" and the reset signal CN="H" are set in the master latch 43A, the NAND circuit 301 and the NAND circuit 302 effectively function as inverters, respectively.

Further, in the slave latch 45A, when the set signal is set to SN="H" and the reset signal is set to CN="H", the NAND circuit 303 and the NAND circuit 304 effectively function as inverters, respectively.

Therefore, the volatile storage unit 11 of the fifth embodiment is practically the same as the volatile storage unit 11 of the first embodiment, and performs the same operation according to the states of the restore control signal SR1 and the store control signal SR2.

Further, when the set signal SN="H" and the reset signal CN="H" are set in the comparison unit 250A, the NAND circuit 301 and the NAND circuit 302 effectively function as inverters, respectively. Therefore, the NAND circuit 301 and the NAND circuit 302 work together to operate as a latch circuit.

Therefore, the comparison unit 250A of the fifth embodiment is practically the same as the comparison unit 250 of the third embodiment, and performs the same operation according to a state of the verify restore control signal SR3.

Next, the operations of the master latch 43A, the slave latch 45A, and the comparison unit 250A will be mainly described in the set mode.

When the set signal SN="L" and the reset signal CN="H" are set in the master latch 43A, the NAND circuit 301 always outputs "H", and the NAND circuit 302 effectively functions as an inverter and always outputs "L".

Further, when the set signal SN="L" and the reset signal CN="H" are set in the slave latch 45A, the NAND circuit 303 always outputs "H", and the NAND circuit 304 practically functions as an inverter and always outputs "L".

Further, when the set signal SN="L" and the reset signal CN="H" are set in the comparison unit 250A, the NAND circuit 305 always outputs "H", and the NAND circuit 306 practically functions as an inverter and always outputs "L".

Therefore, the master latch 43A, the slave latch 45A, and the comparison unit 250A of the fifth embodiment maintain the above-described constant set state regardless of the input state.

Next, the operations of the master latch 43A, the slave latch 45A, and the comparison unit 250A will be mainly described in the reset mode.

When the set signal SN="H" and the reset signal CN="L" are set in the master latch 43A, the NAND circuit 301 effectively functions as an inverter and always outputs "L", and the NAND circuit 302 always outputs "H".

Further, when the set signal SN="L" and the reset signal CN="H" are set in the slave latch 45A, the NAND circuit 303 effectively functions as an inverter and always outputs "L", and the NAND circuit 303 always outputs "H".

Further, when the set signal SN="H" and the reset signal CN="L" are set in the comparison unit 250A, the NAND circuit 305 practically functions as an inverter and always outputs "L", and the NAND circuit 306 always outputs "H".

Therefore, the master latch 43A, the slave latch 45A, and the comparison unit 250A of the fifth embodiment maintain the above-described constant reset state regardless of the input state.

As described above, according to the configuration of the fifth embodiment, the same effect as that of the first embodiment and the third embodiment is achieved, and the operation state of the NVDFF circuit 10E can be fixed to the predetermined state by the set signal SN and the reset signal CN. Accordingly, the operation state of the NVDFF circuit 10E can be easily confirmed.

[6] Sixth Embodiment

Figure 9:
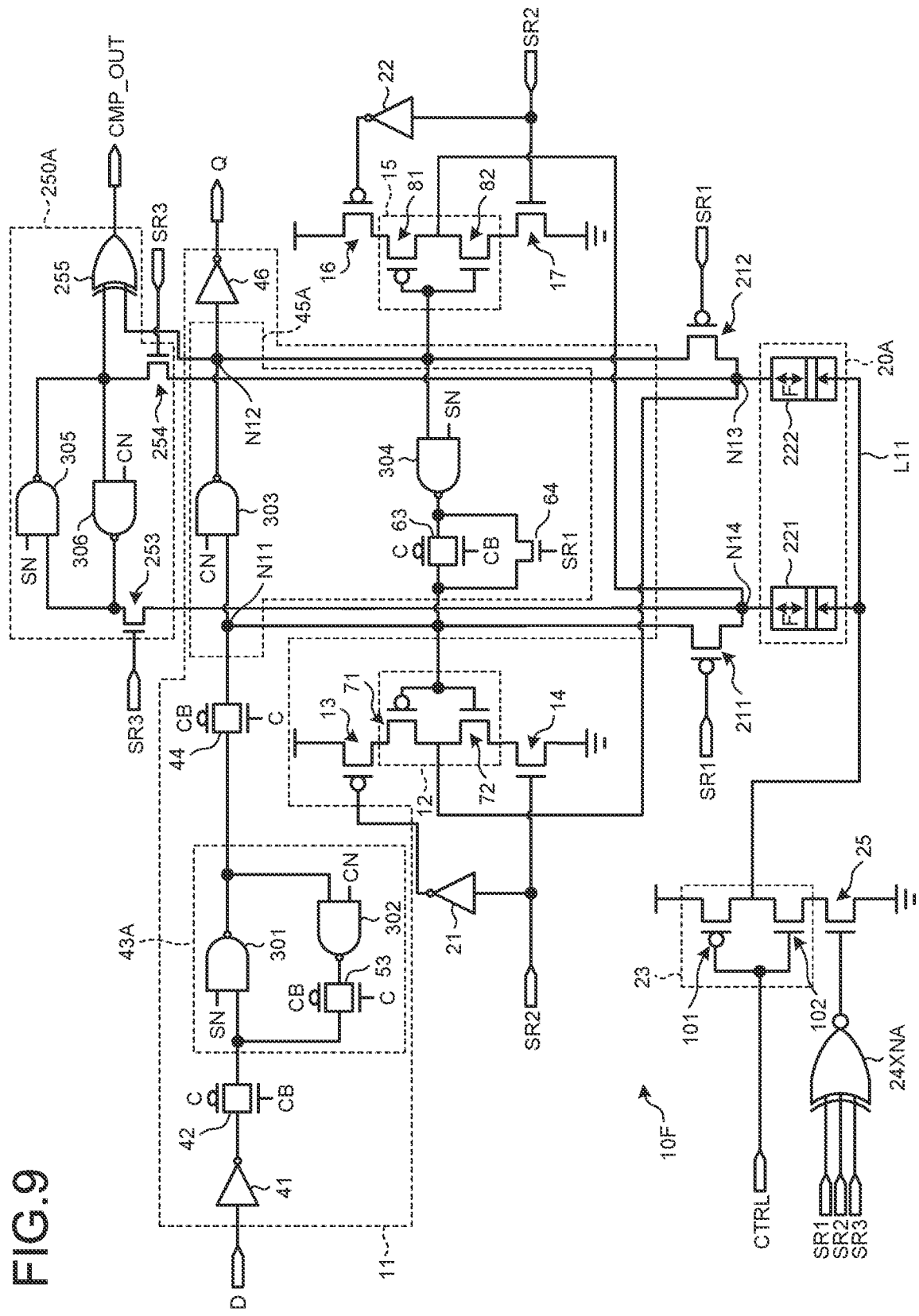
FIG. 9 is a diagram illustrating a configuration example of an NVDFF circuit of a footer type SSR-NVFF circuit system having a verify function and a set/reset function.

FIG. 9 is a diagram illustrating a configuration example of an NVDFF circuit of a footer type SSR-NVFF circuit system having a verify function and a set/reset function.

In FIG. 9, the same parts as those in the fifth embodiment in FIG. 8 are given the same reference signs.

An NVDFF circuit 10F in the sixth embodiment differs from the fifth embodiment in that a three-input XNOR circuit 24XNA is provided instead of the three-input OR circuit 24A, and the restore control signal SR1, the store control signal SR2, and the verify restore control signal SR3 are input.

According to these configurations, the store operation and the restore operation are the same as those in the second embodiment, and the verify restore operation is the same as the fifth embodiment.

Therefore, also in the sixth embodiment, as in the fifth embodiment, even when the input ends of the store driver 12 and the store driver 15 become the intermediate voltage between the power supply voltage and the ground level, wasteful restore current does not flow and power consumption can be reduced. Accordingly, the verify restore operation improves the reliability of the store operation, and it is possible to downsize and keep power consumption low while maintaining stable writing.

[7] Seventh Embodiment

Figure 10:
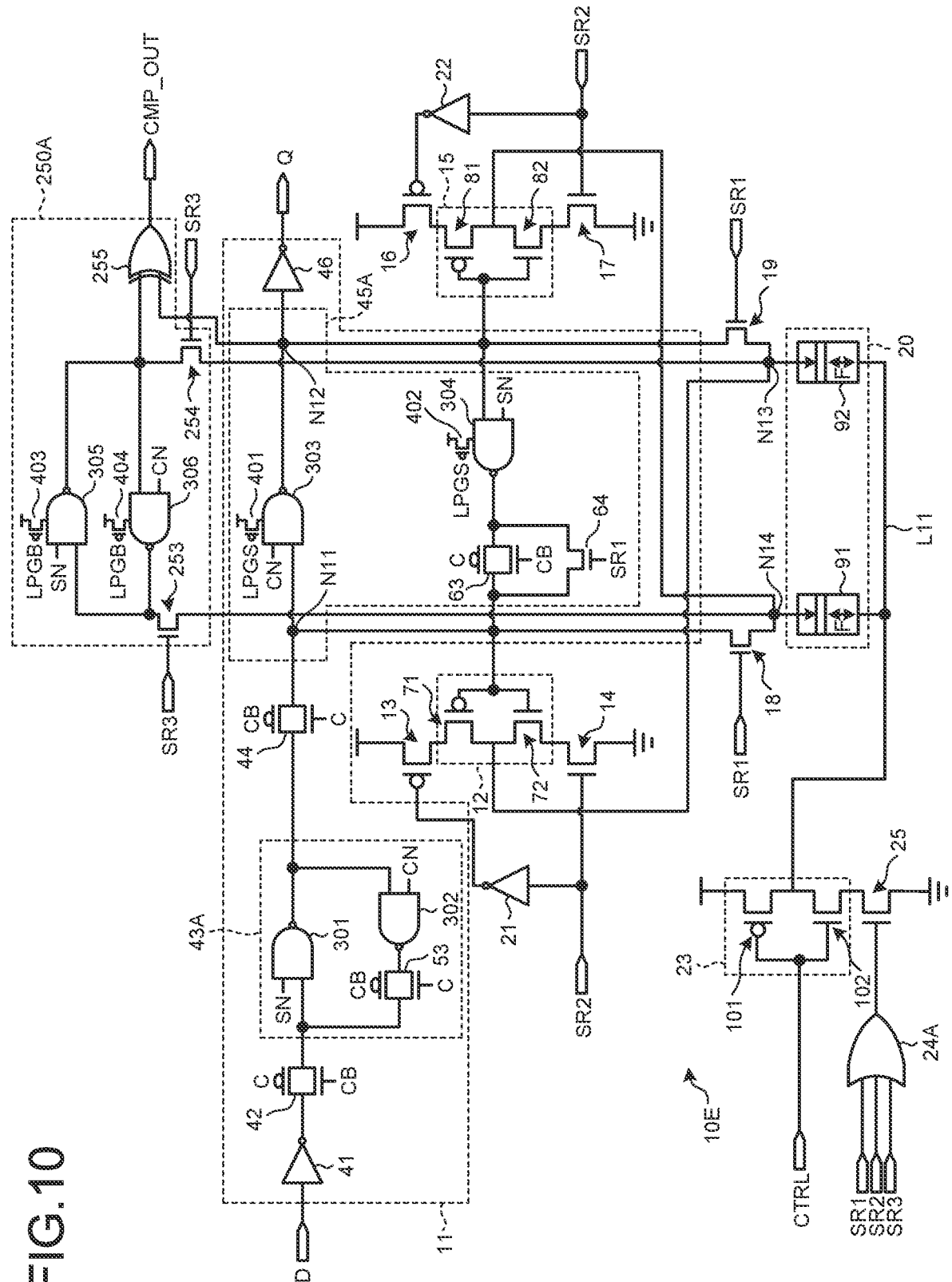
FIG. 10 is a diagram illustrating another configuration example of the NVDFF circuit of the header type SSR-NVFF circuit system having the verify function and the set/reset function.

FIG. 10 is a diagram illustrating another configuration example of the NVDFF circuit of the header type SSR-NVFF circuit system having the verify function and the set/reset function.

In FIG. 10, the same parts as those in FIG. 8 are given the same reference signs, and detailed description will be referred thereto.

In FIG. 10, a difference from the fifth embodiment in FIG. 8 is that a power gating switch 401 and a power gating switch 402 are provided in the NAND circuit 303 and the NAND circuit 304 (high potential side power supply terminal) configuring the slave latch 45A to shut off the power supply to the NAND circuit 303 and the NAND circuit 304 and reduce the leakage current when the slave latch 45A is not used. Still more, a power gating switch 403 and a power gating switch 404 are provided in the NAND circuit 305 and the NAND circuit 305 (high potential side power terminal) configuring the comparison unit 250A to shut off the power supply to the NAND circuit 305 and the NAND circuit 306 and reduce the leakage current when the comparison unit 250A is not used.

As a result, according to the seventh embodiment, when the slave latch 45A is not used, a control signal LPGS turns off (non-conducting state) the power gating switch 401 and the power gating switch 402 to shut off the power supply to the NAND circuit 303 and the NAND circuit 304. Accordingly, the leakage current via the NAND circuit 303 and the NAND circuit 304 is shut off to further reduce power consumption.

Further, when the comparison unit 250A is not used, a control signal LPGB turns off (non-conducting state) the power supply to the power gating switch 403 and the power gating switch 404 to shut off the power supply to the NAND circuit 305 and the NAND circuit 306. Accordingly, the leakage current via the NAND circuit 305 and the NAND circuit 306 is shut off to further reduce power consumption.

As described above, according to the seventh embodiment, in addition to the effect of the fifth embodiment, the power supply to the slave latch circuit 45A or the comparison unit 250A is shut off when the slave latch circuit 45A or the comparison unit 250A is not used, and thus the leakage current can be further reduced.

[8] Eighth Embodiment

Figure 11:
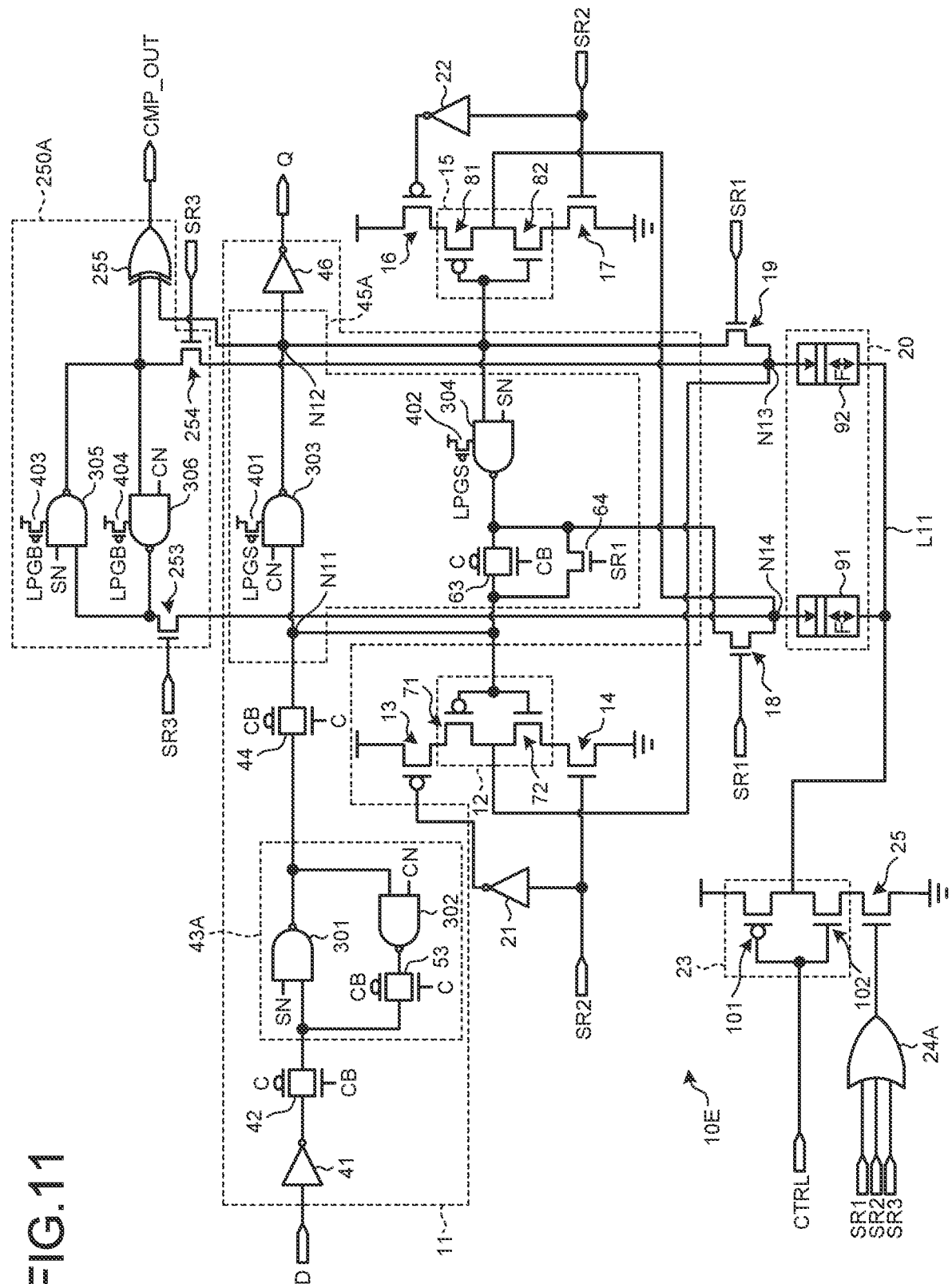
FIG. 11 is a diagram illustrating still another configuration example of the NVDFF circuit of the header type SSR-NVFF circuit system having the verify function and the set/reset function.

FIG. 11 is a diagram illustrating still another configuration example of the NVDFF circuit of the header type SSR-NVFF circuit system having the verify function and the set/reset function.

In FIG. 11, the same parts as those in FIG. 10 are given the same reference signs, and detailed description will be referred thereto.

In FIG. 11, a difference from the seventh embodiment in FIG. 10 is that one terminal of the transistor 18 is connected to a connection point, instead of the storage node N11, between the transistor 64 and the transmission gate 63, so as to change a current path at the time of restoration.

According to this configuration, in addition to the effect of the seventh embodiment, the current path to the transistor 18 is formed via the transistor 64 at the time of restoration. Accordingly, the leakage current can be further reduced to reduce power consumption.

[9] Ninth Embodiment

Figure 12:
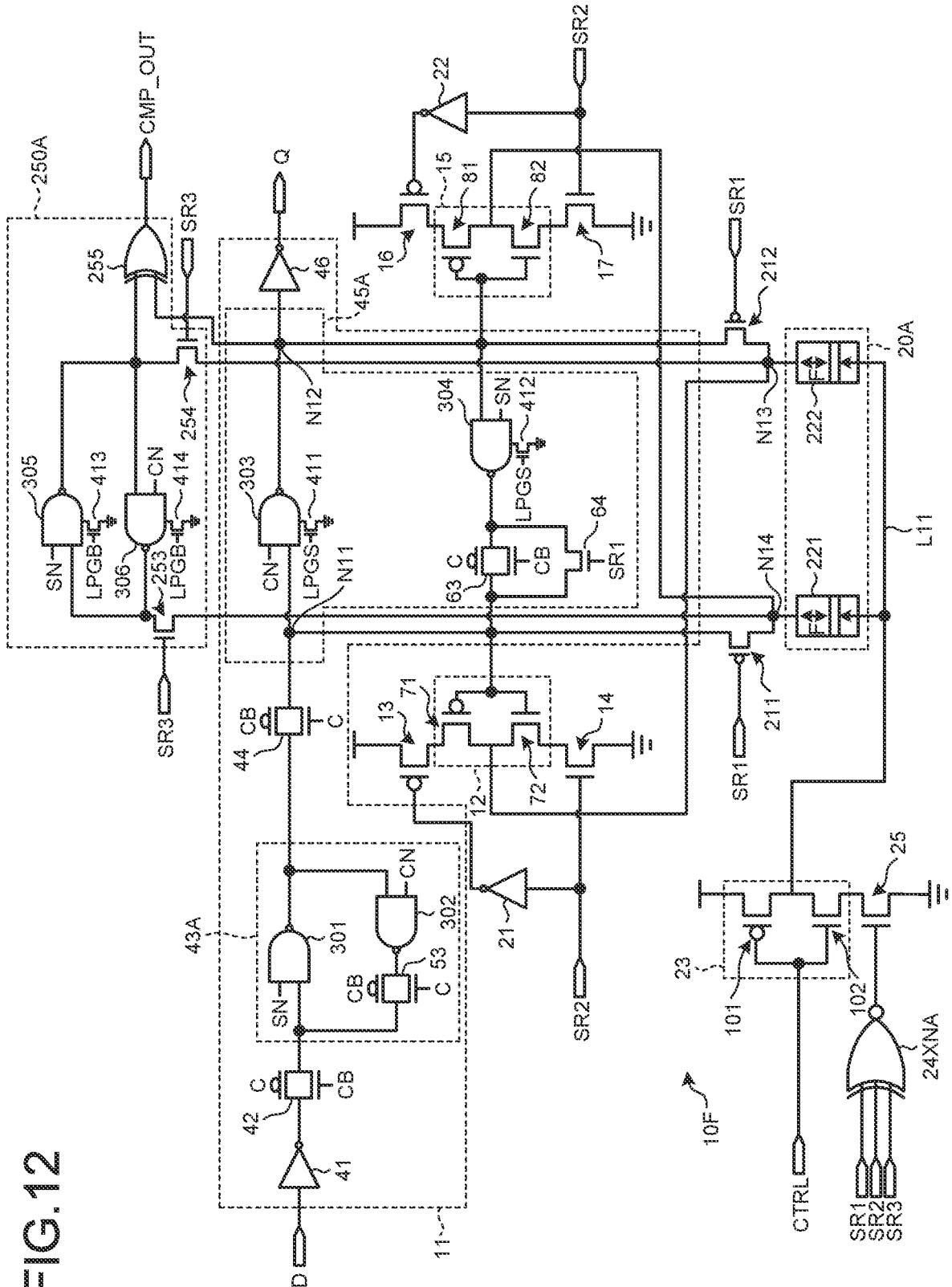
FIG. 12 is a diagram illustrating still another configuration example of the NVDFF circuit of the footer type SSR-NVFF circuit system having the verify function and the set/reset function.
Figure 13:
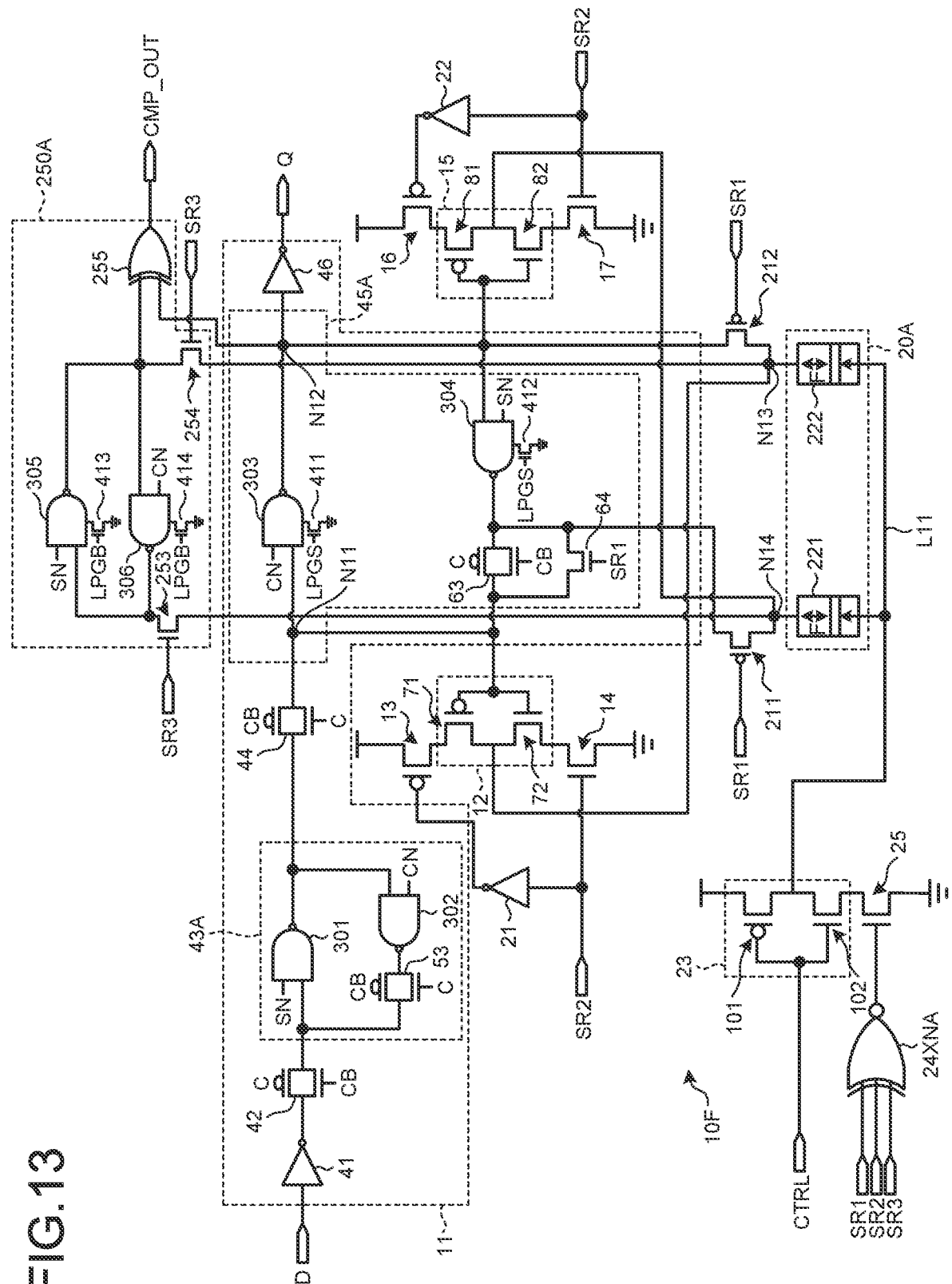
FIG. 13 is a diagram illustrating still another configuration example of the NVDFF circuit of the footer type SSR-NVFF circuit system having the verify function and the set/reset function.

FIG. 12 is a diagram illustrating still another configuration example of the NVDFF circuit of the footer type SSR-NVFF circuit system having the verify function and the set/reset function.

In FIG. 12, the same parts as those in FIG. 9 are given the same reference signs, and detailed description is referred thereto.

In FIG. 12, a difference from the sixth embodiment in FIG. 9 is that a power gating switch 411 and a power gating switch 412 are provided in the NAND circuit 303 and the NAND circuit 304 (low potential side power terminal) configuring the slave latch 45A to shut off the power supply to the NAND circuit 303 and the NAND circuit 304 and reduce the leakage current when the slave latch 45A is not used. Still more, a power gating switch 413 and a power gating switch 414 are provided in the NAND circuit 305 and the NAND circuit 305 (low potential side power terminal) configuring the comparison unit 250A to shut off the power supply to the NAND circuit 305 and the NAND circuit 306 when the comparison unit 250A is not used.

As a result, according to the ninth embodiment, when the slave latch 45A is not used, the control signal LPGS turns off (open state) the power gating switch 411 and the power gating switch 412 to shut off the power supply to the NAND circuit 303 and the NAND circuit 304. As a result, the leakage current via the NAND circuit 303 and the NAND circuit 304 is shut off to further reduce power consumption.

Further, when the comparison unit 250A is not used, the control signal LPGB turns off (open state) the power gating switch 413 and the power gating switch 414 to shut off the power supply to the NAND circuit 305 and the NAND circuit 306. As a result, the leakage current via the NAND circuit 305 and the NAND circuit 306 can be shut off to further reduce power consumption.

As described above, according to the ninth embodiment, in addition to the effect of the sixth embodiment, the power supply to the slave latch circuit 45A or the comparison unit 250A is shut off when the slave latch circuit 45A or the comparison unit 250A is not used, and thus the leakage current can be further reduced.

[10] Tenth Embodiment

FIG. 12 is a diagram illustrating still another configuration example of the NVDFF circuit of the header type SSR-NVFF circuit system having the verify function and the set/reset function.

In FIG. 12, the same parts as those in FIG. 11 are given the same reference signs, and detailed description is referred thereto.

In FIG. 12, a difference from the ninth embodiment in FIG. 11 is that one terminal of the transistor 18 is connected to a connection point, instead of the storage node N11, between the transistor 64 and the transmission gate 63 to change a current path at the time of restoration.

According to this configuration, in addition to the effect of the ninth embodiment, the current path to the transistor 18 is formed via the transistor 64 at the time of restoration. Accordingly, the leakage current can be further reduced to reduce power consumption.

The embodiments of the present technique are not limited to the above-described embodiments, and various changes can be made without departing from the gist of the present technique.

Further, the present technique can also have the following configurations.

(1)

A non-volatile storage circuit comprising:
a volatile storage unit that stores information;
a non-volatile storage unit into which the information in the volatile storage unit is written by a store operation, and from which the information is read out to the volatile storage unit by a restore operation via a restore path different from a store path in the store operation;
a driver unit that receives a power supply and performs the store operation; and
a switch unit that shuts off the power supply to the driver unit during the restore operation.

(2)

The non-volatile storage circuit according to (1), wherein the switch unit includes a first switch provided between a high potential side power supply and the driver unit.

(3)

The non-volatile storage circuit according to (2), wherein the switch unit includes a second switch provided between a low potential side power supply and the driver unit.

(4)

The non-volatile storage circuit according to any one of (1) to (3), wherein
the driver unit is configured as an inverter.

(5)

The non-volatile storage circuit according to (2) or (3), wherein
the first switch is a P-channel MOS transistor.

(6)

The non-volatile storage circuit according to (3), wherein the second switch is an N-channel MOS transistor.

(7)

The non-volatile storage circuit according to any one of (1) to (6), wherein
the volatile storage unit includes a first storage node and a second storage node,
the non-volatile storage unit includes a first storage element and a second storage element,
the first storage node and the first storage element are connected via a first transistor, and
the second storage node and the second storage element are connected via a second transistor.

(8)

The non-volatile storage circuit according to (7), wherein the driver unit includes a first driver and a second driver,
the first storage node and the second storage element are connected via the second driver, and
the second storage node and the first storage element are connected via the first driver.

(9)

The non-volatile storage circuit according to (8), wherein the first storage element and the second storage element are MTJs or ReRAMs.

REFERENCE SIGNS LIST 10, 10A to 10F NVDFF CIRCUIT
11 VOLATILE STORAGE UNIT
12 STORE DRIVER (FIRST DRIVER)
15 STORE DRIVER (SECOND DRIVER)
13, 16 TRANSISTOR (FIRST SWITCH, SWITCH UNIT)
14, 17 TRANSISTOR (SECOND SWITCH, SWITCH UNIT)
18, 211 TRANSISTOR (SECOND TRANSISTOR)
19, 212 TRANSISTOR (FIRST TRANSISTOR)
20, 20A, 213 NON-VOLATILE STORAGE UNIT
91, 221 MTJ (FIRST STORAGE ELEMENT)
92, 222 MTJ (SECOND STORAGE ELEMENT)

The invention claimed is:

1. A non-volatile storage circuit comprising:
a volatile storage unit that stores information;
a non-volatile storage unit into which the information in the volatile storage unit is written by a store operation, and from which the information is read out to the volatile storage unit by a restore operation via a restore path different from a store path in the store operation;
a driver unit that receives a power supply and performs the store operation; and
a switch unit that shuts off the power supply to the driver unit during the restore operation, wherein
the volatile storage unit includes a first storage node and a second storage node,
the non-volatile storage unit includes a first storage element and a second storage element,
the first storage node and the first storage element are connected via a first transistor, and
the second storage node and the second storage element are connected via a second transistor.

2. The non-volatile storage circuit according to claim 1, wherein
the switch unit includes a first switch provided between a high potential side power supply and the driver unit.

3. The non-volatile storage circuit according to claim 2, wherein
the switch unit includes a second switch provided between a low potential side power supply and the driver unit.

4. The non-volatile storage circuit according to claim 1, wherein
the driver unit is configured as an inverter.

5. The non-volatile storage circuit according to claim 2, wherein
the first switch is a P-channel MOS transistor.

6. The non-volatile storage circuit according to claim 3, wherein
the second switch is an N-channel MOS transistor.

7. The non-volatile storage circuit according to claim 1, wherein
the driver unit includes a first driver and a second driver,
the first storage node and the second storage element are connected via the second driver, and
the second storage node and the first storage element are connected via the first driver.

* * * * *